US011664398B2

(12) United States Patent
Chen et al.

(10) Patent No.: US 11,664,398 B2
(45) Date of Patent: May 30, 2023

(54) IMAGE SENSOR AND MANUFACTURING METHOD THEREOF

(71) Applicant: Taiwan Semiconductor Manufacturing Co., Ltd., Hsinchu (TW)

(72) Inventors: Chung-Lei Chen, Hsinchu (TW); Clark Lee, Taipei (TW); Wen-Sheng Wang, Hsinchu (TW); Chien-Li Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 172 days.

(21) Appl. No.: 16/894,901

(22) Filed: Jun. 8, 2020

(65) Prior Publication Data

US 2021/0098516 A1 Apr. 1, 2021

Related U.S. Application Data

(60) Provisional application No. 62/906,750, filed on Sep. 27, 2019.

(51) Int. Cl.
*H01L 27/146* (2006.01)

(52) U.S. Cl.
CPC .. *H01L 27/14614* (2013.01); *H01L 27/14623* (2013.01); *H01L 27/14643* (2013.01); *H01L 27/14685* (2013.01); *H01L 27/14689* (2013.01)

(58) Field of Classification Search
CPC ......... H01L 27/14614; H01L 27/14623; H01L 27/14643; H01L 27/14685; H01L 27/14689
See application file for complete search history.

(56) References Cited

U.S. PATENT DOCUMENTS 5,432,363 A * 7/1995 Kamisaka ......... H01L 27/14831
257/233
7,915,654 B2 * 3/2011 Park .................. H01L 27/14623
257/292

(Continued)

FOREIGN PATENT DOCUMENTS

| CN | 101322241 | 12/2008 |
|----|-----------|---------|
| TW | 201919220 | 5/2019 |
| TW | 201924068 | 6/2019 |

OTHER PUBLICATIONS

"Office Action of Taiwan Counterpart Application", dated Apr. 13, 2021, p. 1-p. 7.

*Primary Examiner* — Mounir S Amer
*Assistant Examiner* — Alexander Belousov
(74) *Attorney, Agent, or Firm* — JCIPRNET

(57) ABSTRACT

An image sensor includes a storage device, where the storage device includes a memory element, a first dielectric layer and a light shielding element. The memory element includes a storage node and a storage transistor gate, where the storage transistor gate is located over the storage node. The first dielectric layer is located over a portion of the storage transistor gate. The light shielding element is located on the first dielectric layer and includes a semiconductor layer. The semiconductor layer is electrically isolated from the memory element, where the light shielding element is overlapped with at least a part of a perimeter of the storage transistor gate in a vertical projection on a plane along a stacking direction of the memory element and the light shielding element, and the stacking direction is normal to the plane.

15 Claims, 18 Drawing Sheets

(56) References Cited

U.S. PATENT DOCUMENTS

| | | | |
|---|---|---|---|
| 8,497,537 B2* | 7/2013 | Wang | H01L 21/02107 257/310 |
| 8,598,640 B2* | 12/2013 | Kitano | H01L 27/14601 257/292 |
| 8,716,719 B2* | 5/2014 | Matsumura | H01L 27/14612 257/293 |
| 9,276,031 B2* | 3/2016 | Wan | H01L 27/1464 |
| 9,508,766 B2* | 11/2016 | Noh | H01L 27/14616 |
| 10,347,543 B2* | 7/2019 | Baars | H01L 29/4941 |
| 10,367,018 B2* | 7/2019 | Cheng | H01L 27/14623 |
| 11,075,238 B2* | 7/2021 | Cheng | H01L 27/14618 |
| 2008/0224195 A1* | 9/2008 | Wang | H01L 28/57 257/295 |
| 2009/0219421 A1* | 9/2009 | Altice, Jr. | H01L 27/14641 250/214.1 |
| 2010/0062559 A1* | 3/2010 | Park | H01L 27/14698 257/E31.127 |
| 2012/0161299 A1* | 6/2012 | Gambino | H01L 27/14632 257/659 |
| 2012/0301989 A1* | 11/2012 | Hashimoto | H01L 31/18 438/57 |
| 2013/0149796 A1* | 6/2013 | Wang | H01L 28/65 438/3 |
| 2014/0015013 A1* | 1/2014 | Arakawa | H01L 31/18 438/73 |
| 2014/0077283 A1* | 3/2014 | Lenchenkov | H01L 27/14629 257/292 |
| 2014/0078359 A1* | 3/2014 | Lenchenkov | H04N 5/335 257/432 |
| 2016/0027828 A1* | 1/2016 | Lee | H01L 27/14643 257/229 |
| 2016/0035774 A1* | 2/2016 | Noh | H01L 27/14603 257/229 |
| 2018/0213167 A1* | 7/2018 | Miki | H01L 27/14656 |
| 2019/0140003 A1* | 5/2019 | Cheng | H01L 27/14612 |
| 2019/0148245 A1* | 5/2019 | Baars | H01L 29/4933 257/351 |
| 2019/0355771 A1* | 11/2019 | Cheng | H01L 27/14623 |
| 2021/0098516 A1* | 4/2021 | Chen | H01L 27/14603 |

* cited by examiner

IMAGE SENSOR AND MANUFACTURING METHOD THEREOF

CROSS-REFERENCE TO RELATED APPLICATION

This application claims the priority benefit of U.S. provisional application Ser. No. 62/906,750, filed on Sep. 27, 2019. The entirety of the above-mentioned patent application is hereby incorporated by reference herein and made a part of this specification.

BACKGROUND

In order to capture fast-moving objects, it is preferred to use an image sensor with a global shutter. Global shutters are often implanted by placing a memory element, in addition to a photodiode and readout circuitry, within each pixel of an image sensor array. The memory element is configured to temporarily store photo-generated charges, thereby allowing each row of the image sensor array to start an exposure at a same time.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
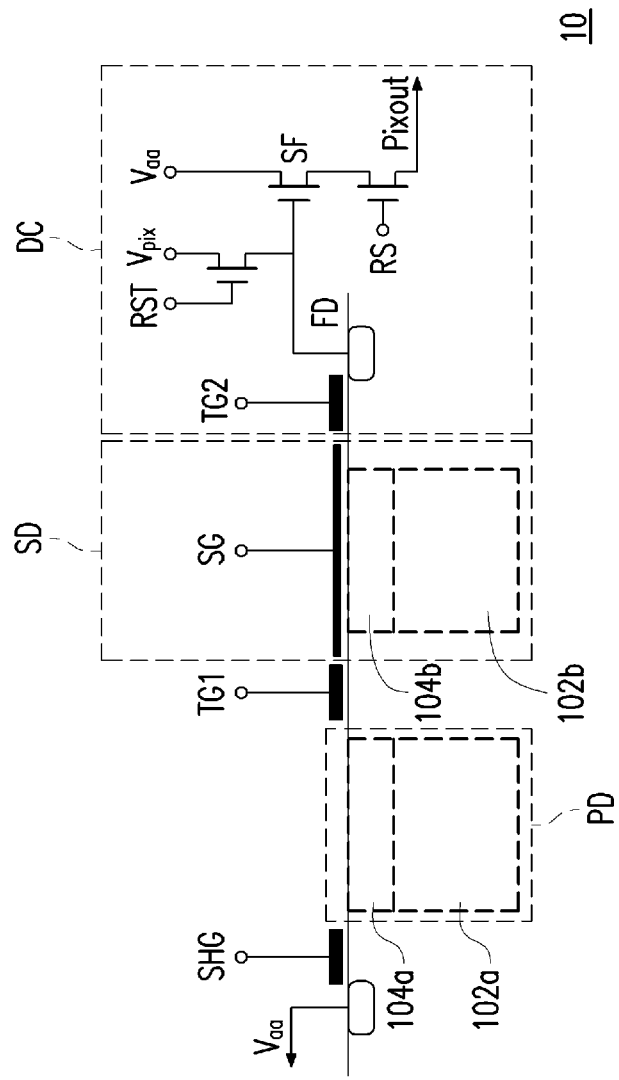
FIG. 1 is a schematic diagram illustrating an image sensor in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

FIG. 1 is a schematic diagram illustrating an image sensor included in a semiconductor structure in accordance with some embodiments of the disclosure. Referring to FIG. 1, in some embodiments, an image sensor 10 includes a shutter gate transistor SHG, a photosensitive device PD, a first transfer gate transistor TG1, a storage device SD and a driving circuit DC. The image sensor 10 may be referred to as a complementary metal-oxide-semiconductor (CMOS) image sensor. For example, the image sensor 10 includes global shutter. It should be noted that the elements illustrated in FIG. 1 may constitute one pixel unit of the image sensor 10. In other words, for simplicity, only one pixel unit is illustrated for representation. It should be understood that the image sensor 10 may include a pixel array constituted by multiple pixel units.

In some embodiments, the photosensitive device PD is constituted by a P-N junction formed by a first doped region 102a and a second doped region 104a. In some embodiments, the first doped region 102a is doped with n-type dopants while the second doped region 104a is doped with p-type dopants. However, it construes no limitation in the disclosure. Depending on the conductivity type of the substrate for constructing the semiconductor structure, the dopants in the first doped region 102a and the second doped region 104a may be interchanged. Upon irradiation of an incident light, the photosensitive device PD is able to accumulate image charges in response to the incident light. For example, the photosensitive device PD includes a photodiode. It should be noted that photodiode merely serves as an exemplary illustration of the photosensitive device PD, and the disclosure is not limited thereto. Other suitable photosensitive devices may be adapted as long as such device is able to accumulate image charges upon irradiation of incident light. For example, the photosensitive device PD may include a memory device with a charge storage.

In some embodiments, the shutter gate transistor SHG is coupled to the photosensitive device PD. For example, a source or a drain of the shutter gate transistor SHG is coupled to voltage $V_{aa}$ to selectively deplete the image charges accumulated in the photosensitive device PD. In some embodiments, the first transfer gate transistor TG1 is located between the photosensitive device PD and the storage device SD. In some embodiments, the first transfer gate transistor TG1 is able to control the transfer of the image charges accumulated in the photosensitive device PD to the storage device SD. For example, during operation of the image sensor 10, the first transfer gate transistor TG1 is able to receive a transfer signal and performs transfer of the image charges accumulated in the photosensitive device PD to the storage device SD based on the transfer signal.

In some embodiments, the storage device SD is coupled to the first transfer gate transistor TG1 and the photosensitive device PD to receive the image charges accumulated in the photosensitive device PD and to store the received image charges in the depletion region. As illustrated in FIG. 1, the storage device SD may be adjacent to the photosensitive device PD. In some embodiments, the storage device SD includes a first doped region 102b, a second doped region 104b, and a storage gate electrode SG. In some embodiments, the image charges are stored in the first doped region 102b, the second doped region 104b, and the substrate (for example, a substrate 100 illustrated in FIG. 3) underneath the second doped region 104b. The first doped region 102b of the storage device SD and the first doped region 102a of the photosensitive device PD may be formed simultaneously by the same step. Similarly, the second doped region 104b of the storage device SD and the second doped region 104a of the photosensitive device PD may also be formed simultaneously by the same step. However, the disclosure is not limited thereto. In some alternative embodiments, the first doped regions 102a, 102b and the second doped regions 104a, 104b may be individually formed by different steps. The structure of the storage device SD will be discussed in greater detail later in conjunction with FIG. 2, FIG. 3 through FIG. 12, and FIG. 13.

In some embodiments, the driving circuit DC is disposed adjacent to the storage device SD. The driving circuit DC includes a second transfer gate transistor TG2, a floating diffusion FD, a reset transistor RST, a source follower transistor SF, and a row select transistor RS. In some embodiments, the second transfer gate transistor TG2 is coupled to an output of the storage device SD. Similar to the first transfer gate transistor TG1, the second transfer gate transistor TG2 also provides the function of selectively transferring the image charges accumulated in the storage device SD to the floating diffusion FD. In some embodiments, the second transfer gate transistor TG2 and the storage gate electrode SG may work together to transfer the image charges stored in the storage device SD to the floating diffusion FD. For example, a bias may be applied to the storage gate electrode SG and a gate of the second transfer gate transistor TG2 to generate an electrical field such that a channel for movement of the charges is created. In some embodiments, due to the electrical field generated, the charges stored in the first doped region 102b, the second doped region 104b, and the substrate underneath the second doped region 104b are pulled out from the first doped region 102b and the second doped region 104b to enter a channel of the second transfer gate transistor TG2 adjacent to the storage device SD. Thereafter, these charges may travel through the channel of the second transfer gate transistor TG2 to arrive at the floating diffusion FD. In some embodiments, a drain of the second transfer gate transistor TG2 may serve as a drain for the storage device SD.

In some embodiments, the floating diffusion FD is referred to as a readout node. The floating diffusion FD is, for example, a lightly doped n-type region formed at least partially within a p-well. In some embodiments, the floating diffusion FD may serve as a capacitor for storing the image charges.

As illustrated in FIG. 1, in some embodiments, the reset transistor RST is coupled to the floating diffusion FD and voltage $V_{pix}$ to selectively reset the image charges in the floating diffusion FD. For example, the reset transistor RST may discharge or charge the floating diffusion FD to a preset voltage in response to a reset signal. In some embodiments, the source follower transistor SF is coupled to the floating diffusion FD and voltage $V_{aa}$. For example, the source follower transistor SF is able to provide high impedance output. The source follower transistor SF may be an amplifier transistor which can amplify the signal of the floating diffusion FD for readout operation. In some embodiments, the row select transistor RS is coupled to the source follower transistor SF. In some embodiments, another end of the row select transistor RS is coupled to a readout column line (not shown) to selectively output the image data Pixout.

Since the driving circuit DC performs the readout function, in some embodiments, the driving circuit DC is referred to as a readout circuit. Moreover, the diagram of the image sensor 10 illustrated in FIG. 1 is merely an example, and the disclosure is not limited thereto. In some alternative embodiments, the image sensor 10 may have different circuit designs. For example, the first transfer gate transistor TG1 may be omitted. In some alternative embodiments, the layout of the components in the driving circuit DC may be altered depending on the circuit requirements. For example, the driving circuit DC is depicted as a four transistor (4T) circuitry in FIG. 1. Nevertheless, in some alternative embodiments, the driving circuit DC may be a 3T circuitry, a 5T circuitry, or any other suitable circuitry.

However, the disclosure is not limited thereto. In certain embodiments, the first transfer gate transistor TG1 is incorporated into the photosensitive device PD, and the second transfer gate transistor TG2 is incorporated into the storage device SD, such that the driving circuit DC is a three transistor (3T) circuitry including the reset transistor RST, the source follower transistor SF and the row select transistor RS.

The operation of the image sensor 10 will be briefly described below. In order to prevent the signals to be received from mixing with the signals previously received, a reset process is first performed. During the reset process, a reference voltage $V_{cc}$ is applied onto the reset transistor RST to turn on the reset transistor RST and the voltage $V_{pix}$ is changed to the reference voltage $V_{cc}$. In some embodiments, the reference voltage $V_{cc}$ may be 3.3V. Thereafter, the electrical potential of the floating diffusion FD is pulled to the reference voltage $V_{cc}$ by the reset transistor RST and the voltage $V_{pix}$. Meanwhile, the storage gate electrode SG and the second transfer gate transistor TG2 are turned on such that the high reference voltage $V_{cc}$ is able to deplete the charges previously stored in the storage device SD, thereby resetting the storage device SD. In some embodiments, the photosensitive device PD is depleted in conjunction with the storage device SD. For example, the voltage $V_{aa}$ may be set to the reference voltage $V_{cc}$, and the shutter gate transistor SHG may be turned on to deplete the charges previously accumulated in the photosensitive device PD. It should be noted that during this stage, the first transfer gate transistor TG1 is off. After ensuring the storage device SD is being reset and the photosensitive device PD is being depleted, the shutter gate transistor SHG, the first transfer gate transistor TG1 and the second transfer gate transistor TG2 are turned off. Upon irradiation of incident light, the image charges are trapped in the photosensitive device PD. In order to access the image charges accumulated in the photosensitive device PD, the first transfer gate transistor TG1 and the storage gate electrode SG are turned on such that the image charges accumulated in the photosensitive device PD are transferred into the storage device SD. In order to access the image charges stored in the storage device SD, the storage gate electrode SG and the second transfer gate transistor TG2 are turned on to transfer the image charges from the depletion region of the storage device SD into the floating diffusion FD. Subsequently, the source follower transistor SF is turned on to amplify the signal of the floating diffusion FD for readout operation and the row select transistor RS is turned on to selectively output the image data Pixout.

Figure 2:
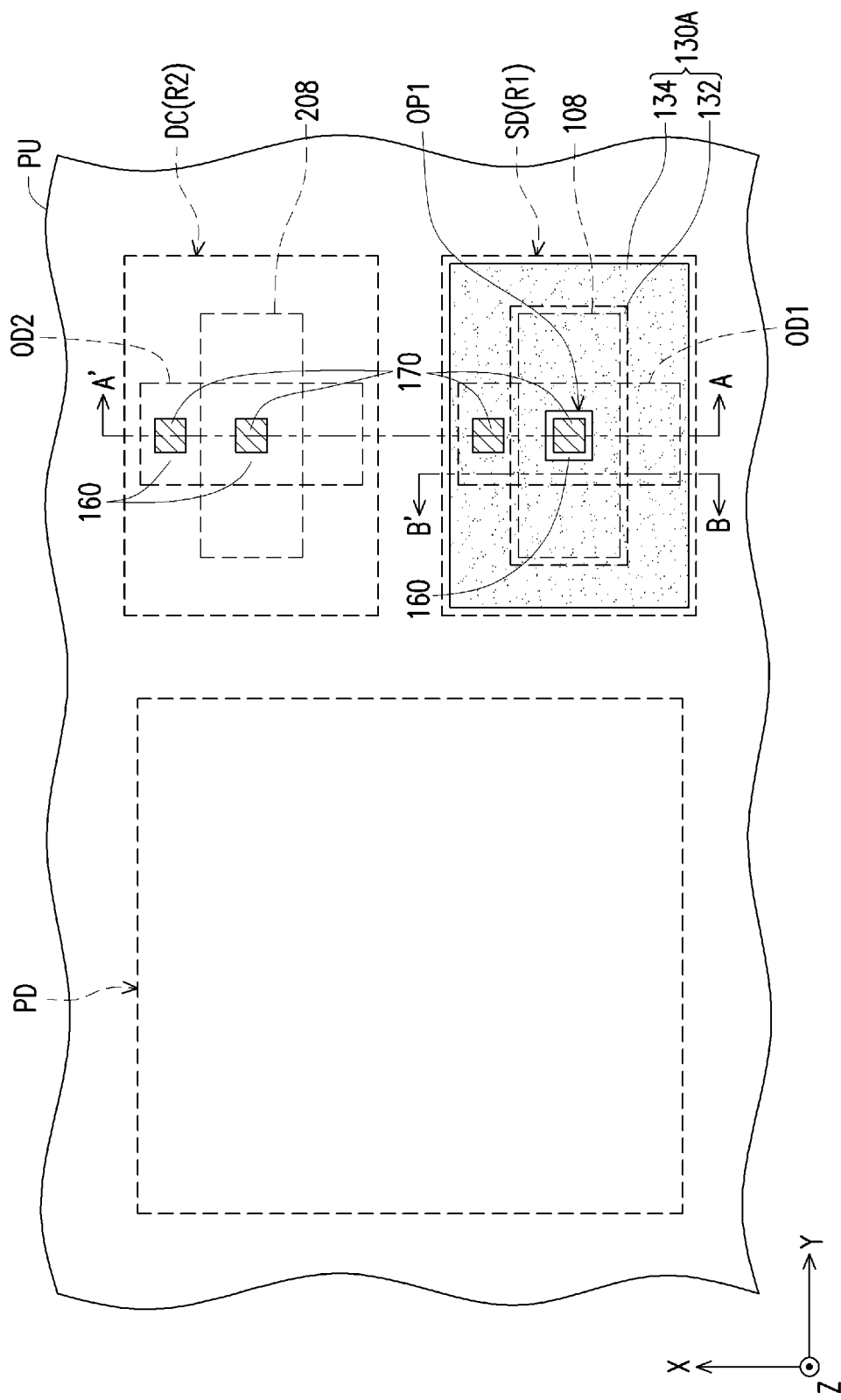
FIG. 2 is a schematic top view of an image sensor in accordance with some embodiments of the disclosure.

FIG. 2 is a schematic top view of a portion of a pixel unit included in an image sensor of a semiconductor structure in accordance with some embodiments of the disclosure, where an arrangement of certain features in one pixel unit PU for the image sensor 10 depicted in FIG. 1 is stressed for illustration purposes. For example, positioning locations of the photosensitive device PD, the storage device SD and the driving circuit DC are shown in FIG. 2 for easy illustration. In some embodiments, the storage device SD and the driving circuit DC are arranged next to each other along a direction Y to facilitate an electrical couple of the storage device SD and the driving circuit DC, and the storage device SD and the driving circuit DC are arranged next to the photosensitive device PD along a direction X to facilitate an electrical couple of the storage device SD and the photosensitive device PD, where the direction X is different from the direction Y. The direction X may be perpendicular to the direction Y. However, the disclosure is not limited thereto. Other suitable arrangement may be adapted as long as these above electrical couples can be achieved with an acceptable loss in the image charges during the transfer of image charges.

Figure 17:
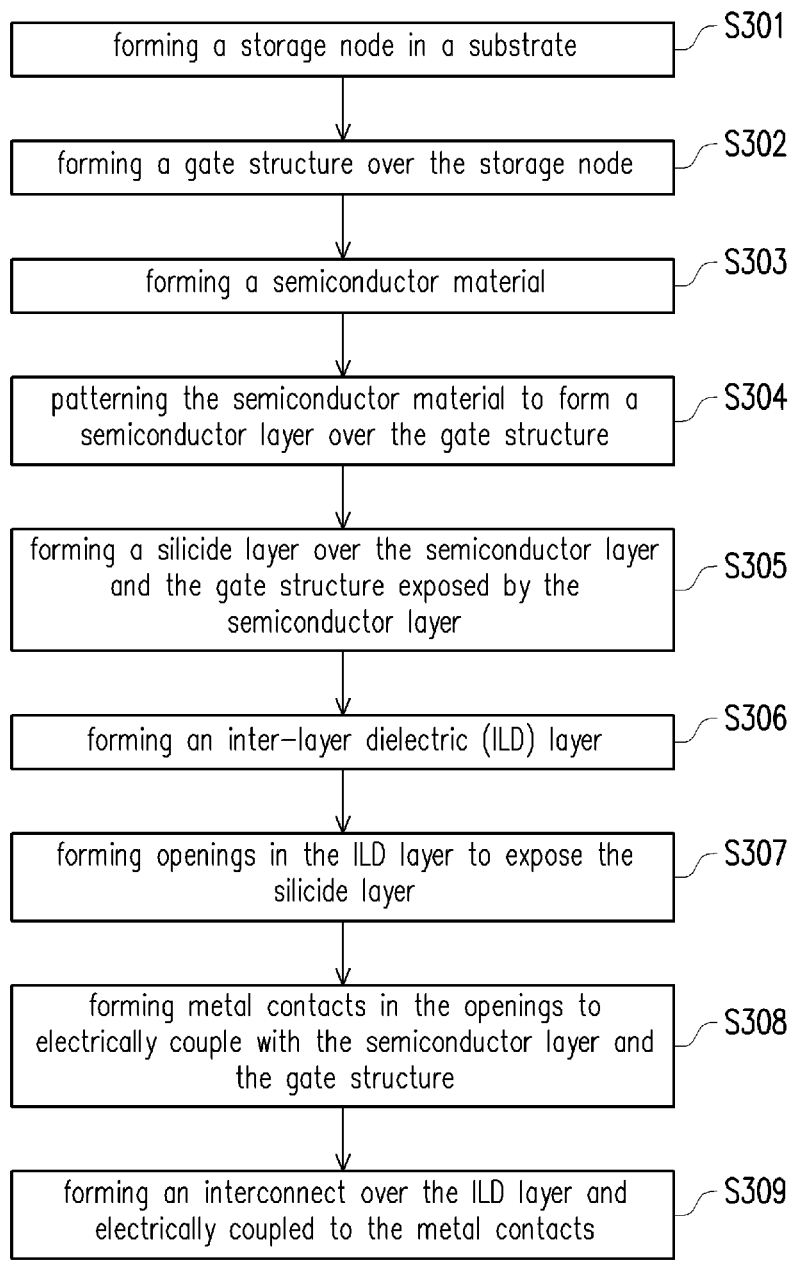
FIG. 17 is a flowchart illustrating a manufacturing method of an image sensor in accordance with some embodiments of the disclosure.

FIG. 3 through FIG. 12 are schematic cross-sectional views of various stages in a method of manufacturing a storage device and a transistor of a pixel unit included in an image sensor in accordance with some embodiments of the disclosure, where FIG. 3 to FIG. 12 are the schematic cross-sectional views of the storage device SD and the transistor (e.g., the transistor RST, SF or RS) taken along a line AA' depicted in FIG. 2. FIG. 13 is a schematic cross-sectional view of a storage device of a pixel unit of a pixel unit included in an image sensor accordance with some embodiments of the disclosure, where FIG. 13 is the schematic cross-sectional view of the storage device SD taken along a line BB' depicted in FIG. 2. FIG. 17 is a flowchart illustrating a manufacturing method of an image sensor included in a semiconductor structure in accordance with some embodiments of the disclosure.

Figure 3:
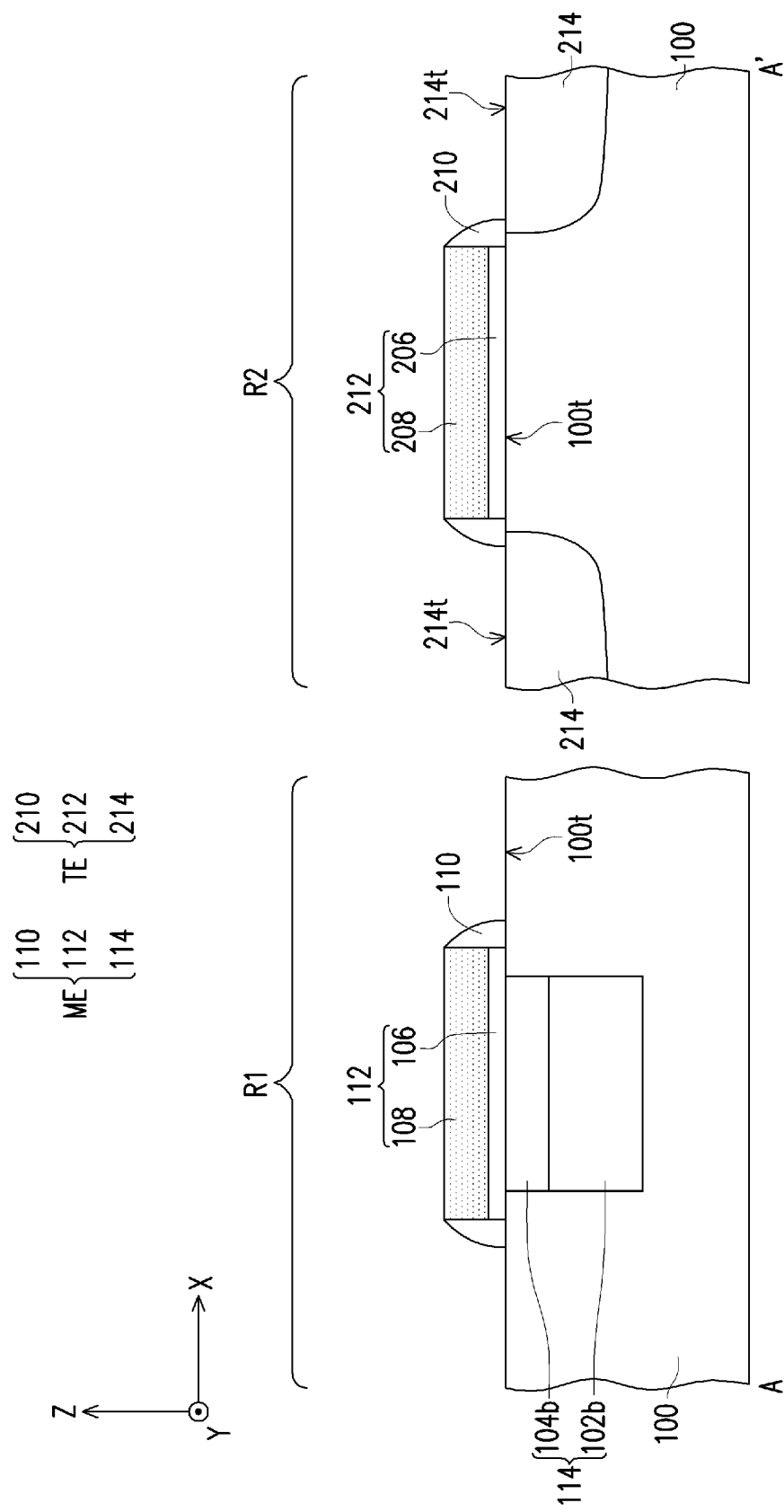
FIG. 3 through FIG. 12 are schematic cross-sectional views of various stages in a method of manufacturing a storage device and a transistor of an image sensor in accordance with some embodiments of the disclosure.

Referring to FIG. 3, in some embodiments, a substrate 100 is provided. As shown in FIG. 3, for example, the substrate 100 is divided into several regions, such as a region R1 (e.g., a location for a memory element ME and a light shielding element LSE in the storage device SD of FIG. 2), a region R2 (e.g., a location for a transistor element(s) TE in the transistor RST, SF or RS of the driving circuit DC of FIG. 2), and other regions (not shown in FIG. 3) (e.g., a location for a photo-sensitive element such as a photosensitive device PD of FIG. 2 or a location for a transistor element(s) in the first transfer gate transistor TG1 or the second transfer gate transistor TG2 (not shown in FIG. 2)). Moreover, for example, the substrate 100 also includes isolation regions (not shown), which are formed to isolate different devices, such the storage device(s) (such as SD) and the transistor(s) (such as RST, SF, RS, TG1, or TG2). The isolation regions may utilize isolation technology, such as local oxidation of silicon (LOCOS) or shallow trench isolation (STI) to electrically isolate the various regions. If the isolation regions are made of STIs, the STI regions may include silicon oxide, silicon nitride, silicon oxynitride, other suitable materials, or a combination thereof. In some examples, the filled trench has a multi-layer structure such as a thermal oxide liner layer filled with silicon nitride or silicon oxide.

In some embodiments, the substrate 100 is a semiconductor substrate. For example, the substrate 100 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. For example, the substrate 100 may be a semiconductor on insulator such as silicon on insulator (SOI) or silicon on sapphire.

In some embodiments, the substrate 100 is a p-type substrate. However, the disclosure is not limited thereto. In some alternative embodiments, an n-type substrate is adapted as the substrate 100. For example, the substrate 100 further includes other features such as various doped regions, a buried layer, and/or an epitaxy layer. The substrate 100 may include various doped regions depending on design requirements (e.g., p-type wells or n-type wells). In some embodiments, the doped regions are doped with p-type dopants, such as boron or BF2, and/or n-type dopants, such as phosphorus or arsenic. Moreover, the doped regions may be formed directly on the substrate 100, in a P-well structure, in an N-well structure, in a dual-well structure, or using a raised structure.

As illustrated in FIG. 3 and in accordance with step S301 of FIG. 17, the first doped region 102b and the second doped region 104b are formed in the substrate 100 within the region R1 to form a memory node 114. The first doped region 102b may be formed by doping the substrate 100 with dopants of a first type and the second doped region 104b may be formed by doping the substrate 100 above the first doped region 102b with dopants of a second type. The dopants of the first type are different from the dopants of the second type, in some embodiments. For example, when the substrate 100 is a p-type substrate, the first doped region 102b may be doped with n-type dopants (such as phosphorous or arsenic) and the second doped region 104b may be doped with p-type dopants (such as boron or BF2) to form a P-N junction between the first doped region 102b and the second doped region 104b. Similarly, when the substrate 100 is an n-type substrate, the first doped region 102b may be doped with p-type dopants and the second doped region 104b may be doped with n-type dopants to form the P-N junction therebetween. In some embodiments, the dopants may be doped into the first doped region 102b and the second doped region 104b through an ion implantation process.

As mentioned above, the first doped region 102a and the second doped region 104a of the photosensitive device PD may be formed by a similar manner as that of the first doped region 102b and the second doped region 104b. Therefore, although not illustrated, it should be understood that the photosensitive device PD is located within the substrate 100.

Continued on FIG. 3 and in accordance with step S302 of FIG. 17, in some embodiments, a gate structure 112 with a pair of spacers 110 disposed at two opposite sides thereof and a gate structure 212 with a pair of spacers 210 disposed at two opposite sides thereof are formed over the substrate 100 respectively within the region R1 (e.g., over the memory node 114) and the region R2. In some embodiments, the gate structure 112 include a gate dielectric layer 106 and a gate electrode 108 stacked thereon along a direction Z, and the spacers 110 are located at two opposite sides of the gate structure 112 along the direction X. In some embodiments, the direction X (and the direction Y) is different form the direction Z. For example, the direction Z is perpendicular to the direction X and/or the direction Y. Similarly, in some embodiments, the gate structure 212 include a gate dielectric layer 206 and a gate electrode 208 stacked thereon along a direction Z, and the spacers 210 are located at two opposite sides of the gate structure 212 along the direction X.

In some embodiments, the gate structure 112 within the region R1 and the gate structure 212 within the region R2 are similar or identical. In some other embodiments, the elements in the gate structure 112 are different from the elements in the gate structure 212. In some embodiments, the spacers 110 within the region R1 and the spacers 210 within the region R2 are similar or identical. In some other embodiments, the spacers 110 are different from the spacers 210. It should be noted that the detail described below with respect to the spacers 110 and the elements of the gate structure 112 may also apply to the spacers 210 and the elements of the gate structure 212, and thus the description of the spacers 210 and the description of the elements in the gate structure 212 are omitted. In other words, the gate structures 112 and 212 are formed via the same steps, and the spacers 110 and 210 are formed via the same steps, for example. However, the disclosure is not limited thereto; alternatively, the gate structures 112 and 212 may be formed in the different steps, and the spacers 110 and 210 may be formed in the different steps.

In some embodiments, the gate dielectric layer 106 and the gate electrode 108 are located over the substrate 100 in sequential order from bottom to top (e.g., in the direction Z). The gate dielectric layer 106 includes silicon oxide, silicon nitride, silicon oxy-nitride, high-k dielectric materials, or a combination thereof. It should be noted that the high-k dielectric materials are generally dielectric materials having a dielectric constant greater than 4. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. In some embodiments, the gate dielectric layer 106 is a high-k dielectric layer with a thickness in the range of about 10 angstroms to 30 angstroms as measured along the direction Z. In some embodiments, the gate electrode 108 is made of polysilicon. The gate electrode 108 may be made of undoped or doped polysilicon. For example, the gate electrode 108 is referred to as a polysilicon gate.

The formations of the gate dielectric layer 106 and the gate electrode 108 can be achieved by forming a blanket layer of a dielectric material (not shown) over the substrate 100; forming a blanket layer of a poly-silicon material (not shown) over the dielectric material blanket layer; patterning the poly-silicon material blanket layer to form the gate electrode 108; and patterning the dielectric material blanket layer to form the gate dielectric layer 106. In one embodiment, the dielectric material blanket layer is formed by using a suitable process, such as atomic layer deposition (ALD), chemical vapor deposition (CVD), physical vapor deposition (PVD), flowable chemical vapor deposition (FCVD), thermal oxidation, UV-ozone oxidation, or a combination thereof. In one embodiment, the poly-silicon material blanket layer is formed by, but not limited to, ALD, CVD, or PVD. The patterning process may include photolithography and etching process, where the etching process may be, but not limited to, dry etching, wet etching, or a combination thereof.

In some embodiments, after the formation of the gate structure 112 (including the gate electric layer 106 and the gate electrode 108), the spacers 110 are formed at the two opposite sides of the gate structure 112 (e.g., sidewalls of the gate electric layer 106 and sidewalls of the gate electrode 108), in some embodiments. The spacers 110 may be formed of silicon oxide, silicon nitride, silicon oxynitride, silicon carbide, fluoride-doped silicate glass (FSG), low-k dielectric materials, or a combination thereof. It should be noted that the low-k dielectric materials are generally dielectric materials having a dielectric constant lower than 3.9. The spacers 110 may have a multi-layer structure which includes one or more liner layers. The liner layer includes a dielectric material such as silicon oxide, silicon nitride, and/or other suitable materials. The formation of the spacers 110 can be achieved by depositing suitable dielectric material and anisotropically etching off the dielectric material.

Up to here, the gate structure 112, the spacers 110 and the memory node 114 formed within the region R1 together construct the memory element ME (of the storage device SD), where the memory node 114 is located in the substrate 100, and the gate structure 112 and the spacers 110 are located on (a top surface 100t of) the substrate 100. For example, the memory node 114 is overlapped with the gate structure 112, and the spacers 110 surround the gate structure 112. In some embodiments, in a vertical projection on a X-Y plane along the direction Z, a perimeter of the memory node 114 is surrounded by an inner edge of the spacers 110. For example, the perimeter of the memory node 114 is distant from the inner edges of the spacers 110 in the vertical projection on the X-Y plane along the direction Z. However, the disclosure is not limited thereto; and alternatively, the perimeter of the memory node 114 may be substantially aligned with the edges of the spacers 110 in the vertical projection on the X-Y plane along the direction Z. In some embodiments, the memory element ME is a part of the storage device SD, where the memory node 114 is referred to as a storage node, and the gate electrode 108 is referred to as a storage gate electrode. In some embodiments, the photosensitive device PD (shown in FIG. 1) may act as a source for the storage device SD, which can provide image charges to the memory node 114 of the memory element ME in the storage device SD.

As illustrated in FIG. 3, in some embodiments, after the formation of the spacers 110, 210, source/drain regions 214 are formed in the substrate 100 at two opposite sides of the gate structure 212 within the region R2 to form the transistor element TE of the transistor (e.g., the transistor RST, SF or RS). For example, the source/drain regions 214 are formed at sidewalls of the gate dielectric layer 206 and sidewalls of the gate electrode 208. In some embodiments, the pair of the source/drain regions 214 may be formed by a doping process, an epitaxy growth process, or a combination thereof. In some embodiments, the source/drain regions 214 are formed by doping the substrate 100 with a p-type dopant or an n-type dopant. In some embodiments, dopants are doped into the source/drain regions 214 through ion implantation. Alternatively, in some embodiments, part of the substrate 100 is removed through etching or other suitable processes and the dopants are formed in the hollowed area through epitaxy growth. In some embodiments, the epitaxial layers include SiGe, SiC, or other suitable materials. In some embodiments, the doping process and the epitaxy growth process may be performed in an in-situ manner to form the source/drain regions 214.

Up to here, the gate structure 212, the spacers 210 and the source/drain regions 214 formed within the region R2 together construct the transistor element TE (of the transistor RST, SF or RS), where the source/drain regions 214 are located in the substrate 100, the gate structure 212 and the spacers 210 are located on (the top surface 100t of) the substrate 100, and a channel (not labelled) is in the substrate 100 between the source/drain region 214 and underlying the gate structure 212 and the spacers 210. For example, the source/drain regions 214 surround the spacers 210, and the spacers 210 surround the gate structure 212. In some embodiments, in the vertical projection on the X-Y plane along the direction Z, the gate structure 212 is surrounded by the source/drain regions 214 and by the spacers 210, where a perimeter of the gate structure 212 is distant from edges of the source/drain regions 214, and the perimeter of the gate structure 212 is substantially aligned with edges of the spacers 210. In one embodiment, the spacers 210 are overlapped with at least a part of the source/drain regions 214 in the vertical projection on the X-Y plane along the direction Z, where the edges of the source/drain regions 214 are distant from the edges of the spacers 210. For example, as shown in FIG. 3, the spacers 210 partially cover surfaces 214t of the source/drain regions 214. However, the disclosure is not limited thereto; and alternatively, the source/drain regions 214 is adjacent to the spacers 210 in the vertical projection on the X-Y plane along the direction Z, where the edges of the source/drain regions 214 are substantially aligned with the edges of the spacers 210. The transistor element TE may be referred to as a metal-oxide-semiconductor (MOS) device. If the dopants in the source/drain regions 214 is the p-type dopants, the transistor element TE is a PMOS device, in one embodiment. If the dopants in the source/drain regions 214 is the n-type dopants, the transistor element TE is a NMOS device, in an alternative embodiment. In some embodiments, the transistor element TE is a part of the transistor serving as a logic transistor located in the driving circuit DC depicted in FIG. 1, such as the reset transistor RST, the source follower transistor SF, and the row select transistor RS.

In some embodiments, a type of the dopants in the source/drain regions 214 are the same as a type of the dopants in the first doped region 102b. However, the disclosure is not limited thereto. In some alternative embodiments, the type of the dopants in the source/drain regions 214 are the same as a type of the dopants in the second doped region 104b.

Figure 4:
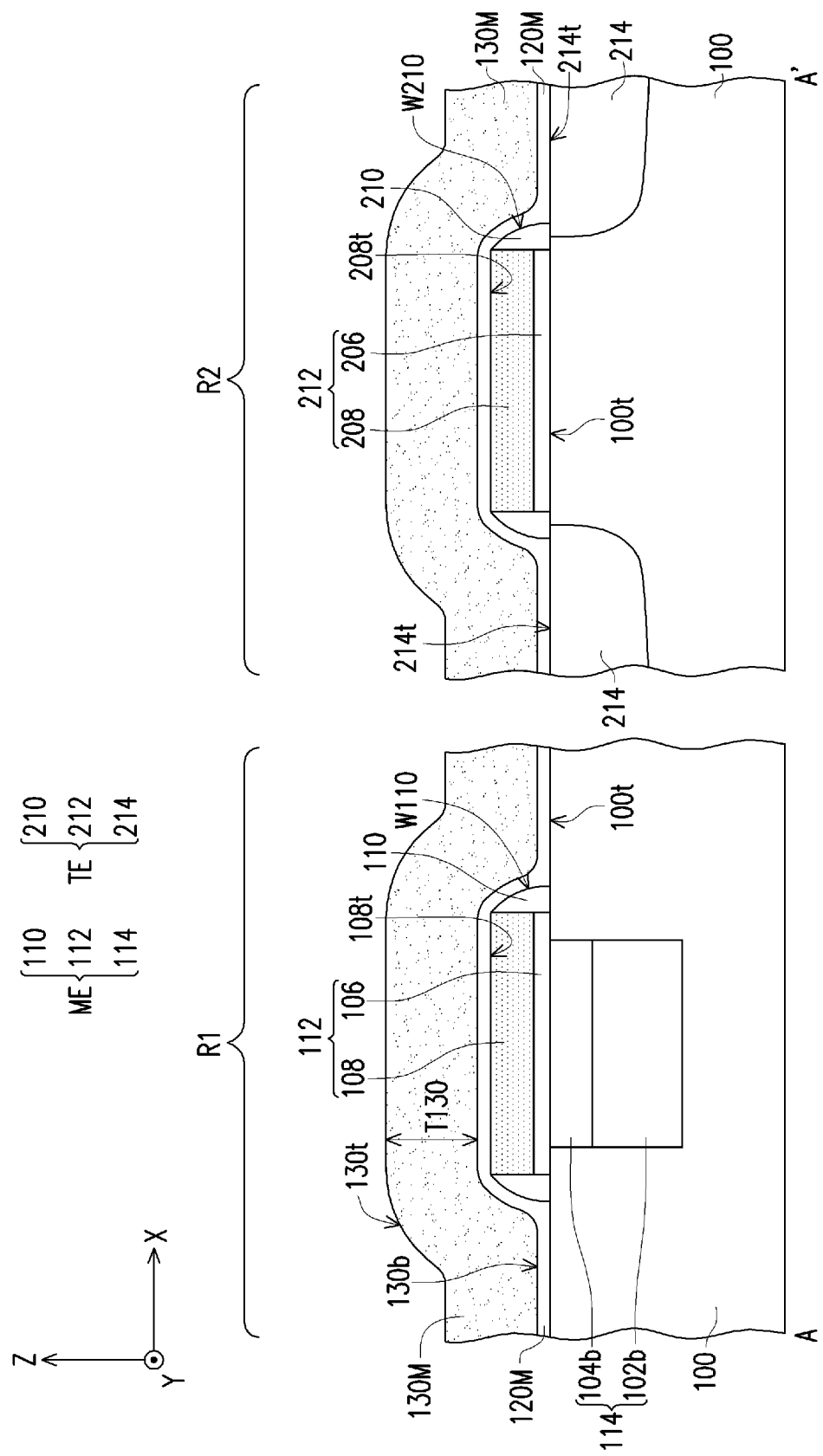

Referring to FIG. 4 and in accordance with step S303 of FIG. 17, in some embodiments, a dielectric material 120M and a semiconductor material 130M are formed over the substrate 100 and cover the memory element ME and the transistor element TE. In some embodiments, the dielectric material 120M and the semiconductor material 130M are individually located over the substrate 100 in a manner of a blanket layer, in sequential order from bottom to top (e.g., in the direction Z). The dielectric material 120M includes silicon oxide formed by deposition or other suitable methods. The deposition may include CVD (e.g., high density plasma (HDP) CVD or sub-atmospheric CVD (SACVD)) or molecular layer deposition (MLD). Alternatively, the material of the dielectric material 120M may include silicon nitride, silicon oxy-nitride, high-k dielectric materials, or the like; the disclosure is not limited thereto. In some embodiments, the dielectric material 120M is conformally formed over the memory element ME, the transistor element TE and the substrate 100 exposed therefrom, where a top surface 108t of the gate electrode 108, sidewalls W110 of the spacers 110, a top surface 208t of the gate electrode 208, sidewalls W210 of the spacers 210, top surface 214t of the source/drain regions 214 and the top surface 100t of the substrate 100 exposed therefrom are covered by the dielectric material 120M. In one embodiment, a thickness of the dielectric material 120M is approximately ranging from 250 angstroms to 350 angstroms as measured along the direction Z.

In some embodiments, the semiconductor material 130M is made of polysilicon or poly-germanium. The semiconductor material 130M may be made of undoped or doped polysilicon or undoped or doped poly-germanium. For example, the semiconductor material 130M is a polysilicon layer formed by deposition (e.g. CVD) or other suitable methods. In some embodiments, the semiconductor material 130M is conformally formed over the dielectric material 120M, where a thickness T130 of the semiconductor material 130M is approximately ranging from 200 angstroms to 500 angstroms as measured along the direction Z (e.g., a shortest distance from a bottom surface 130b of the semiconductor material 130M to a top surface 130t of the semiconductor material 130M).

Figure 5:
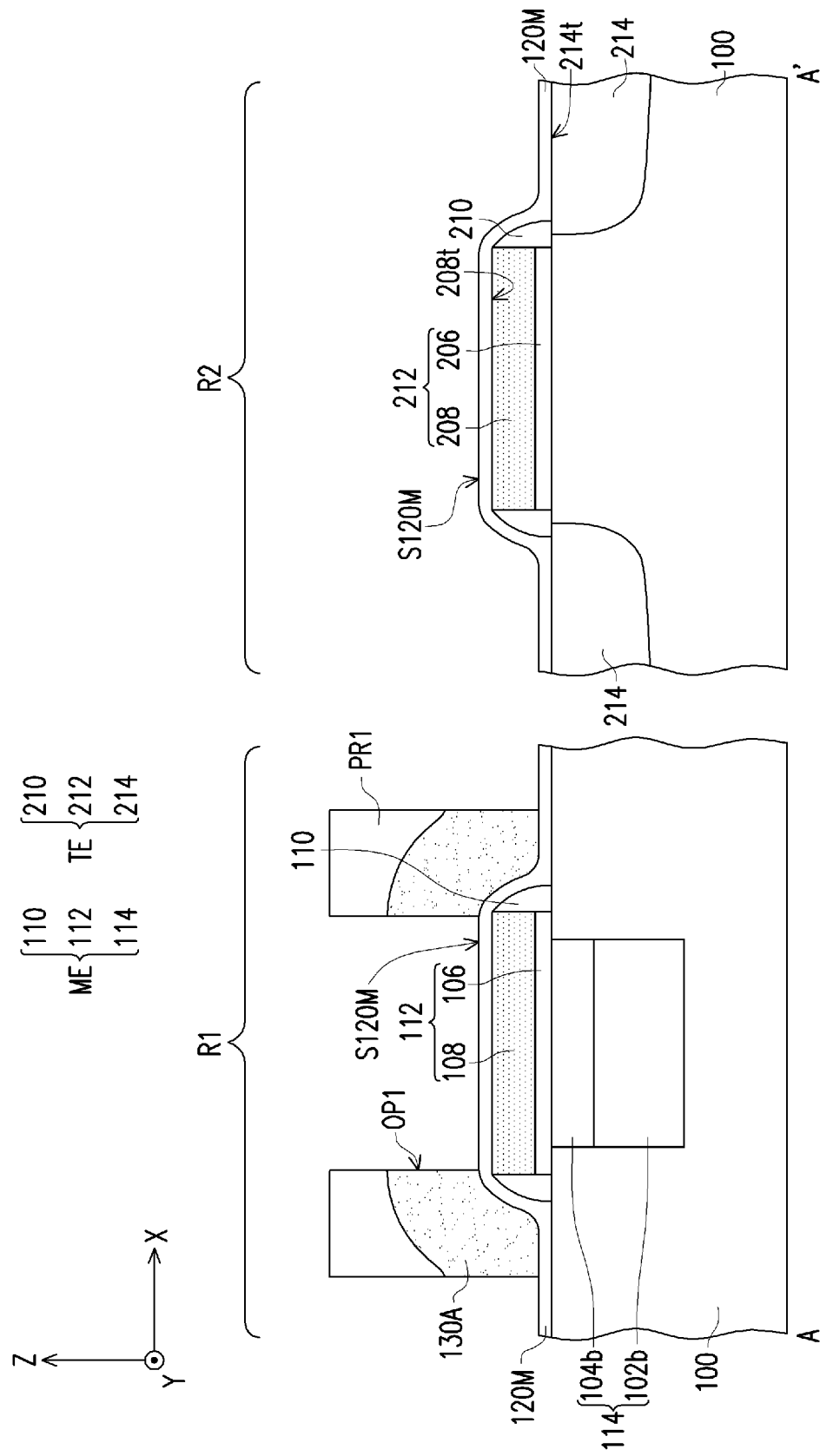

Referring to FIG. 5 and in accordance with step S304 of FIG. 17, in some embodiments, the semiconductor material 130M is patterned to form a semiconductor layer 130A over the memory element ME (e.g., over the gate structure 112 and the spacers 110). In some embodiments, as illustrated in FIG. 5, at least a portion of the semiconductor layer 130A is overlying to and overlapped with the spacers 110 and edges of the gate structure 112 along the direction Z, where a positioning location of an opening (or referred to as "recess" or "trench") OP1 is corresponding to a positioning location of the gate structure 112. In some embodiments, the opening OP1 formed in the semiconductor layer 130A exposes a portion of the dielectric material 120M located over the gate structure 112. For example, a top surface S120M of the dielectric material 120M located within the region R1 is partially exposed by the semiconductor layer 130A. In some embodiments, as shown in FIG. 5, the region R2 is free of the semiconductor layer 130A. For example, a top surface S120M of the dielectric material 120M located within the region R2 is completely exposed by the semiconductor layer 130A.

In some embodiments, the patterning process may include a photolithography process and an etching process. The formation of the semiconductor layer 130A may include forming a photoresist layer PR1 covering a portion of the semiconductor material 130M within the region R1 (e.g., located over the memory element ME) and not covering the semiconductor material 130M within the region R2, and removing the semiconductor material 130M not being covered by the photoresist layer PR1 (within both regions R1 and R2) by etching; and thus the semiconductor layer 130A having the opening OP1 is formed over the memory element ME. In some embodiments, a material of the photoresist layer PR1, for example, includes a positive resist material or a negative resist material, that is suitable for a patterning process such as a photolithography process with a mask or a mask-less photolithography process (for instance, an electron-beam (e-beam) writing or an ion-beam writing). In some embodiments, after the formation of the semiconductor layer 130A, the photoresist layer PR1 is removed. In one embodiment, the photoresist layer PR1 is removed by acceptable ashing process and/or photoresist stripping process, such as using an oxygen plasma or the like. The disclosure is not limited thereto. In some embodiments, the semiconductor layer 130A serves the function of shielding previously formed elements (e.g., the memory element ME) from incident light, where the semiconductor layer 130A is referred to as a shielding layer of the light shielding element LSE for the memory element ME. In some embodiments, the light shielding element LSE is electrically isolated form the memory element ME.

Figure 6:
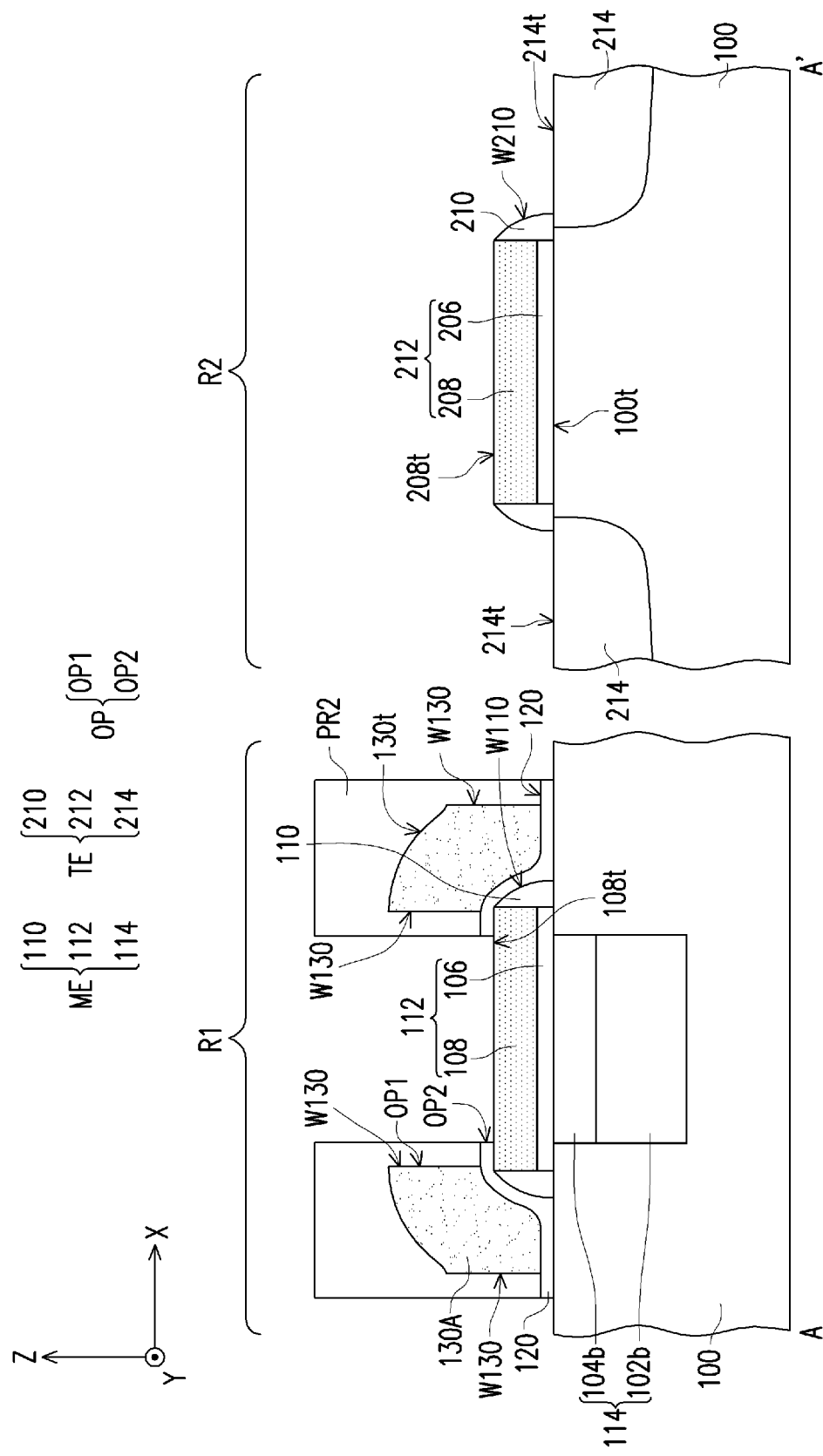

Referring to FIG. 6, in some embodiments, the dielectric material 120M is patterned to form a dielectric layer 120 over the gate structure 112 and the spacers 110, where the dielectric layer 120 having an opening (or referred to as "recess" or "trench") OP2 exposing a portion of the gate structure 112 (e.g., the top surface 108t of the gate electrode 108). In some embodiments, a positioning location of the opening OP2 falls within the positioning location of the opening OP1, and a positioning location of the semiconductor layer 130A falls within a positioning location of the dielectric layer 120, on the X-Y plane. For example, the gate electrode 108 is partially exposed by the opening OP2 formed in the dielectric layer 120, and the dielectric layer 120 and the gate electrode 108 partially exposed by the dielectric layer 120 are exposed by the opening OP1 formed in the semiconductor layer 130A. The opening OP1 is spatially communicated with the opening OP2, in some embodiments. For example, the openings OP1 and OP2 are together referred to as an opening OP. As shown in FIG. 6, in some embodiments, within the region R1, the substrate 100 and the memory element ME are partially exposed by the dielectric layer 120, and the dielectric layer 120 is partially exposed by the semiconductor layer 130A. In some embodiments, the transistor element TE is free of the dielectric layer 120. For example, the transistor element TE and the substrate 100 exposed by the transistor element TE are completely exposed by the dielectric layer 120 and by the semiconductor layer 130A.

The formation of the dielectric layer 120 may include forming a photoresist layer PR2 covering a portion of the dielectric material 120M (with the semiconductor layer 130A overlying thereto) within the region R1 and not covering the dielectric material 120M within the region R2, and removing the dielectric material 120M not being covered by the photoresist layer PR2 (within both regions R1 and R2) by etching; and thus the dielectric layer 120 having the opening OP2 is formed over the memory element ME. A material of the photoresist layer PR2 may be similar to or the same as the material of the photoresist layer PRE and thus is omitted herein. During the etching process, sidewalls W130 and the top surface 130t of the semiconductor layer 130A are covered by the photoresist layer PR2 for avoid any undesired removal of the semiconductor layer 130A. In some embodiments, after the formation of the dielectric layer 120, the photoresist layer PR2 is removed.

Figure 7:
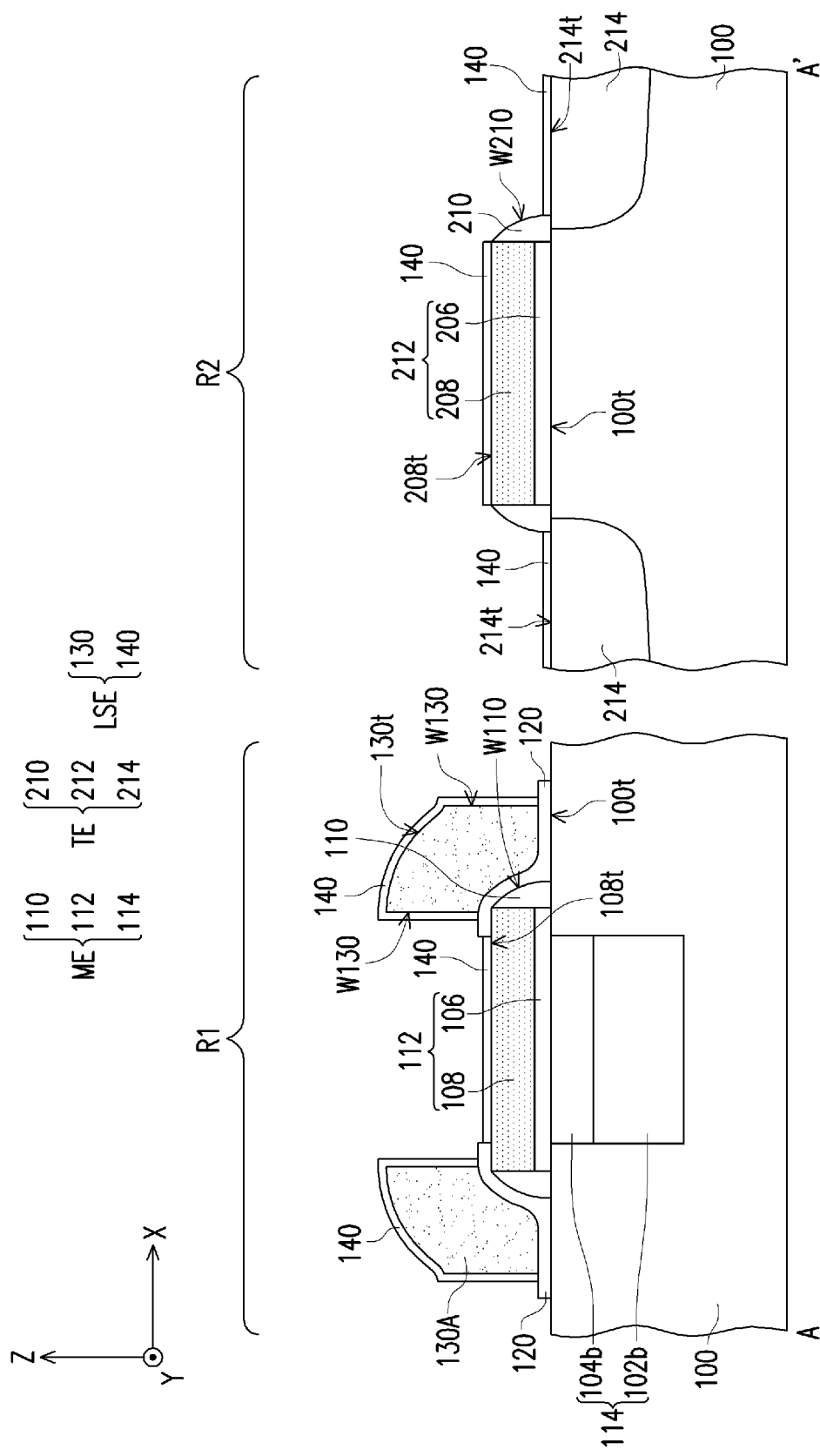

Referring to FIG. 7 and in accordance with step S305 of FIG. 17, in some embodiments, a silicide layer 140 is formed to cover the exposed surfaces (e.g., the top surfaces 130t and the sidewalls W130) of the semiconductor layer 130A, the exposed surface (e.g., the top surface 108t) of the gate electrode 108, the exposed surface (e.g., the top surface 208t) of the gate electrode 208, and the exposed surfaces (e.g., the top surface 214t) of the source/drain regions 214. In some embodiments, the silicide layer 140 is conformally formed to be corresponding to the profiles of the semiconductor layer 130A, the gate electrodes 108, 208, and the source/drain regions 214. In some embodiments, the silicide layer 140 serves the function of providing better electrical conduction between the previously formed elements (e.g., the semiconductor layer 130A, the exposed gate electrodes 108, 208, and the exposed source/drain regions 214) and later-formed elements (e.g., metal contacts) due to a lower electrical resistance between the silicide layer 140 and the later-formed elements. A material of the silicide layer 140 include cobalt silicide, nickel silicide, titanium silicide or tungsten silicide, for example. The silicide layer 140 may be formed of silicide materials and may be formed by deposition, such as PVD, CVD, and ALD. However, the disclosure is not limited thereto.

In some embodiments, as shown in FIG. 7, the silicide layer 140 wraps around the semiconductor layer 130A, where the semiconductor layer 130A and the silicide layer 140 wrapped thereto are together referred to as the light shielding element LSE for the memory element ME in the storage device SD. The light shielding element LSE may overlapped with a perimeter of the memory element ME in the vertical projection on the X-Y plane along the direction Z. In some embodiments, owing to the light shielding element LSE of the storage device SD, when the photosensitive device PD (shown in FIG. 1) provides image charges to the memory node 114 of the memory element ME in the storage device SD, the light shielding element LSE (e.g., including the semiconductor layer 130A and the silicide layer 140) shields the memory element ME from the incident light. With such, the semiconductor layer 130A is not electrically connected with other conductive components within the storage device SD. For example, the light shielding element LSE (e.g., the semiconductor layer 130A) may be grounded.

In some embodiments, the dielectric layer 120 is between the light shielding element LSE (e.g., the semiconductor layer 130A and the silicide layer 140) and the memory element ME (e.g., the gate structure 112 and the spacers 110) and between the semiconductor layer 130A and the substrate 100. It should be noted that a sufficient isolation between the gate electrode 108 and the semiconductor layer 130A is crucial in ensuring the reliability of the storage device SD. For example, when a minimum distance between the gate electrode 108 and the semiconductor layer 130A is sufficient small, the breakdown voltage (Vbd) of the storage device SD would be drastically decreased, causing a phenomenon of Vbd tailing during the reliability test. In other words, the device lifetime of the storage device SD would be reduced when the sufficient isolation between the gate electrode 108 and the semiconductor layer 130A is not presented. Owing to the dielectric layer 120 (with the specific thickness range mentioned above) between the gate electrode 108 (of the memory element ME) and the semiconductor layer 130A (of the light shielding element LSE), the sufficient isolation between the gate electrode 108 and the semiconductor layer 130A can be provided, thereby ensuring longer lifetime of the storage device SD.

Alternatively, the silicide layer 140 may be formed by: forming a metallic conductive material (not shown) to be in contact with the exposed semiconductor layer 130A, the exposed gate electrodes 108, 208, and the exposed source/drain regions 214; performing a thermal treatment on the metallic conductive material, so that the portion of the metallic conductive layer covering (in contact with) the exposed semiconductor layer 130A, the exposed gate electrodes 108, 208, and the exposed source/drain regions 214 is reacted to the exposed semiconductor layer 130A, the exposed gate electrodes 108, 208, and the exposed source/drain regions 214 to form a metal silicide layer (e.g., the silicide layer 140); and removing the rest of the un-reacted metallic conductive layer. The thermal treatment may include, for example, argon (Ar) rapid thermal annealing, hydrogen (H2) furnace thermal annealing, or the like.

Figure 8:
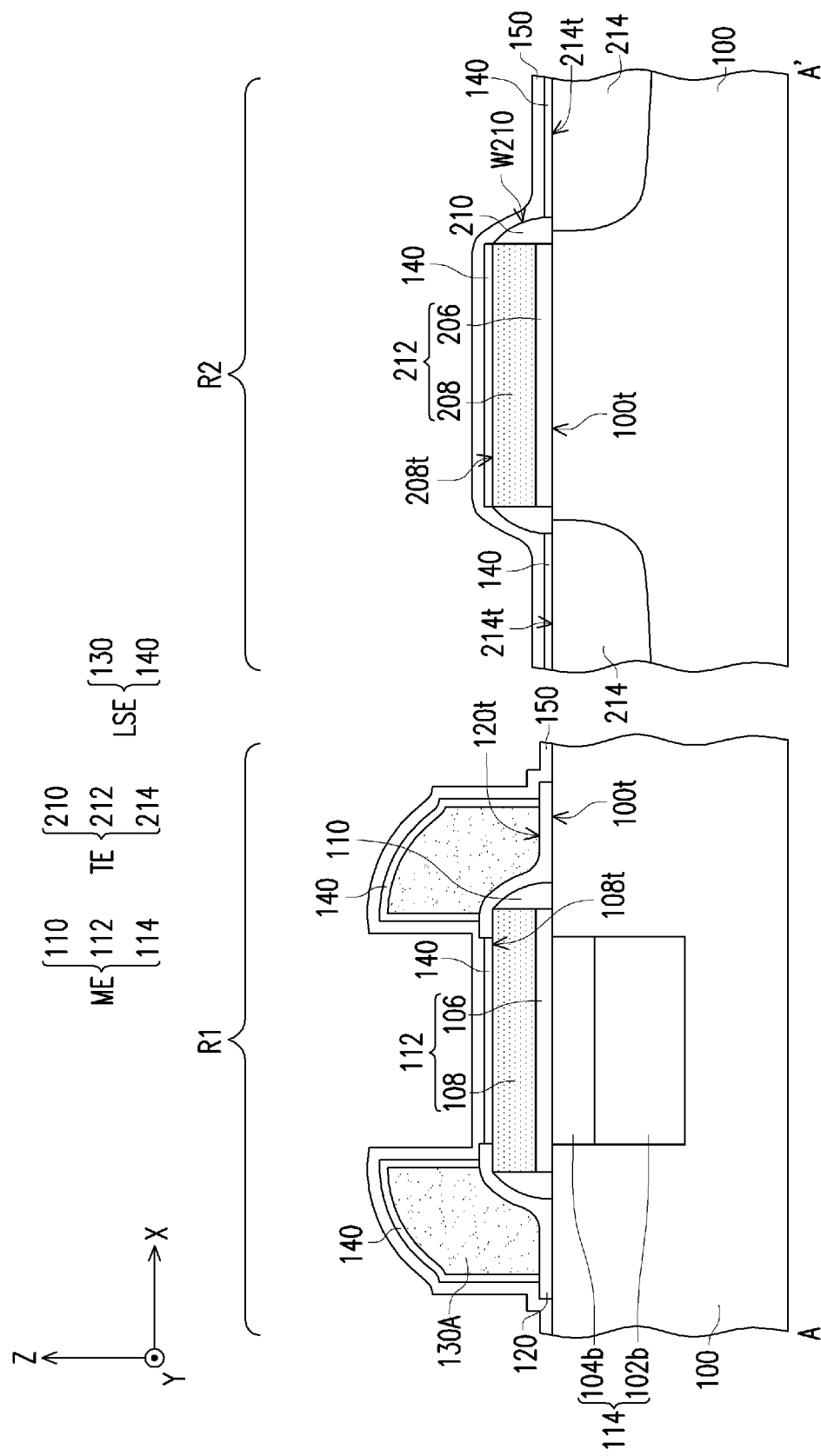

Referring to FIG. 8, in some embodiments, an etch stop layer 150 is formed over the structure depicted in FIG. 7. Specifically, the etch stop layer 150 is formed to overlay the storage device SD (including the memory element ME) and the transistor element TE, as illustrated in FIG. 8. The etch stop layer 150 may be referred to as a contact etch stop layer (CESL). The etch stop layer 150 includes, for example, silicon nitride, carbon-doped silicon nitride, or a combination thereof. In some embodiments, the etch stop layer 150 is, for example, deposited by using processes such as CVD, HDPCVD, SACVD, MLD, or other suitable methods. In some embodiments, before the etch stop layer 150 is formed, a buffer layer (not shown) is further formed over the substrate 100. In an embodiment, the buffer layer is an oxide such as silicon oxide; however, the disclosure is not limited thereto, other composition may be utilized. In some embodiments, the buffer layer is deposited by processes such as CVD, HDPCVD, SACVD, MLD, or other suitable methods.

Figure 9:
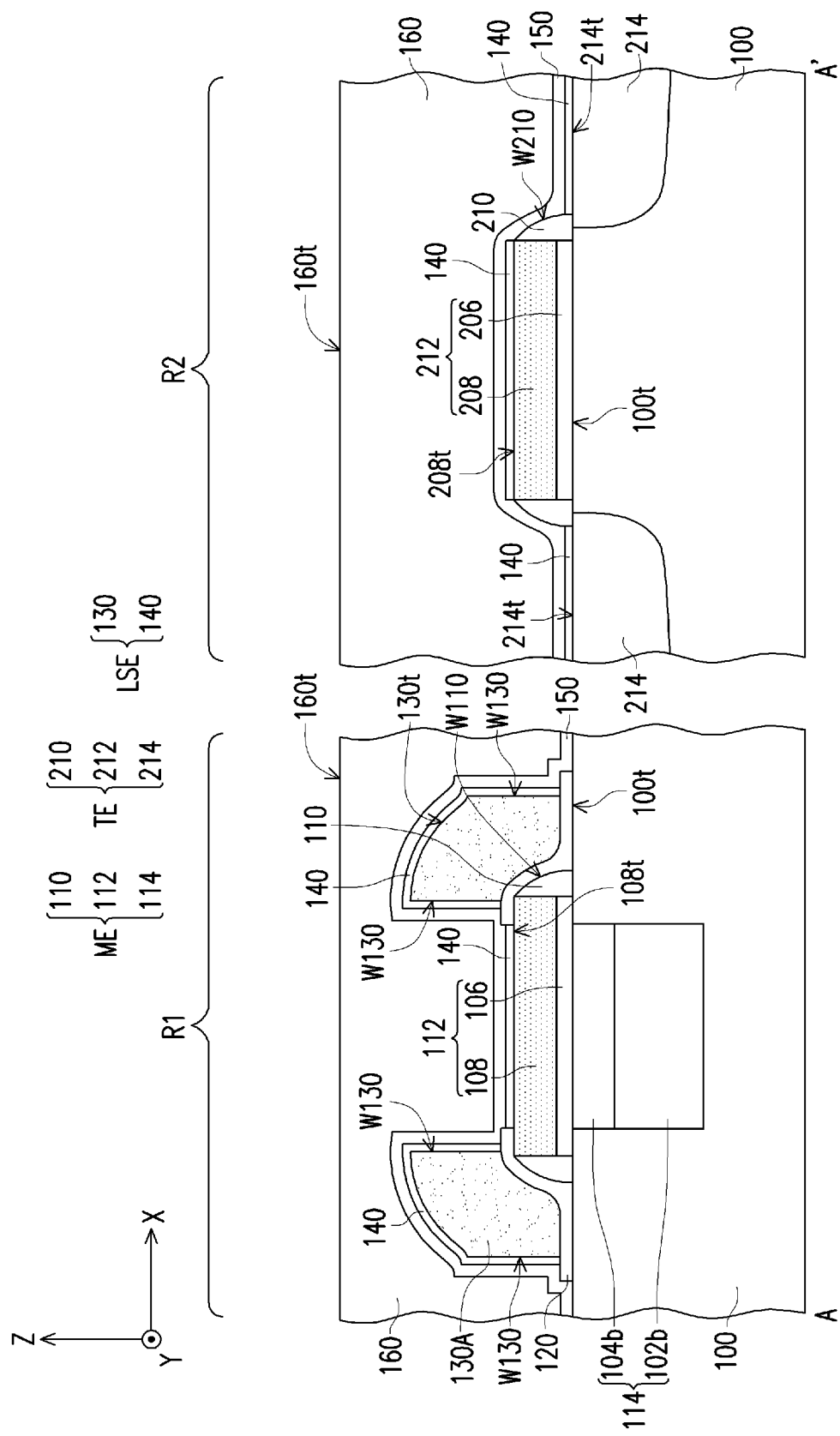

Referring to FIG. 9 and in accordance with step S306 of FIG. 17, in some embodiments, a dielectric layer 160 is formed over the etch stop layer 150 covering the storage device SD (including the memory element ME) and the transistor element TE. In some embodiments, the dielectric layer 160 is formed in a conformal manner. In some embodiments, the dielectric layer 160 is referred to as an interlayer dielectric layer (ILD). The dielectric layer 160 may include silicon oxide, silicon nitride, silicon oxynitride, silicon carbonitride, silicon carbide oxynitride, spin-on glass (SOG), phosphosilicate glass (PSG), borophosphosilicate glass (BPSG), FSG, carbon doped silicon oxide (e.g., SiCOH), polyimide, and/or a combination thereof. In some alternative embodiments, the dielectric layer 160 may include low-K dielectric materials. Examples of low-K dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 160 may include one or more dielectric materials. In some embodiments, the dielectric layer 160 is formed to a suitable thickness by FCVD, CVD, HDPCVD, SACVD, spin-on, sputtering, or other suitable methods.

In some embodiments, the dielectric layer 160 is planarized to obtain a top surface 160t with a high degree of coplanarity to facilitate subsequent process steps. The planarizing process may include a grinding process, a chemical mechanical polishing (CMP) process, an etching process, or other suitable processes, or a combination thereof.

Figure 10:
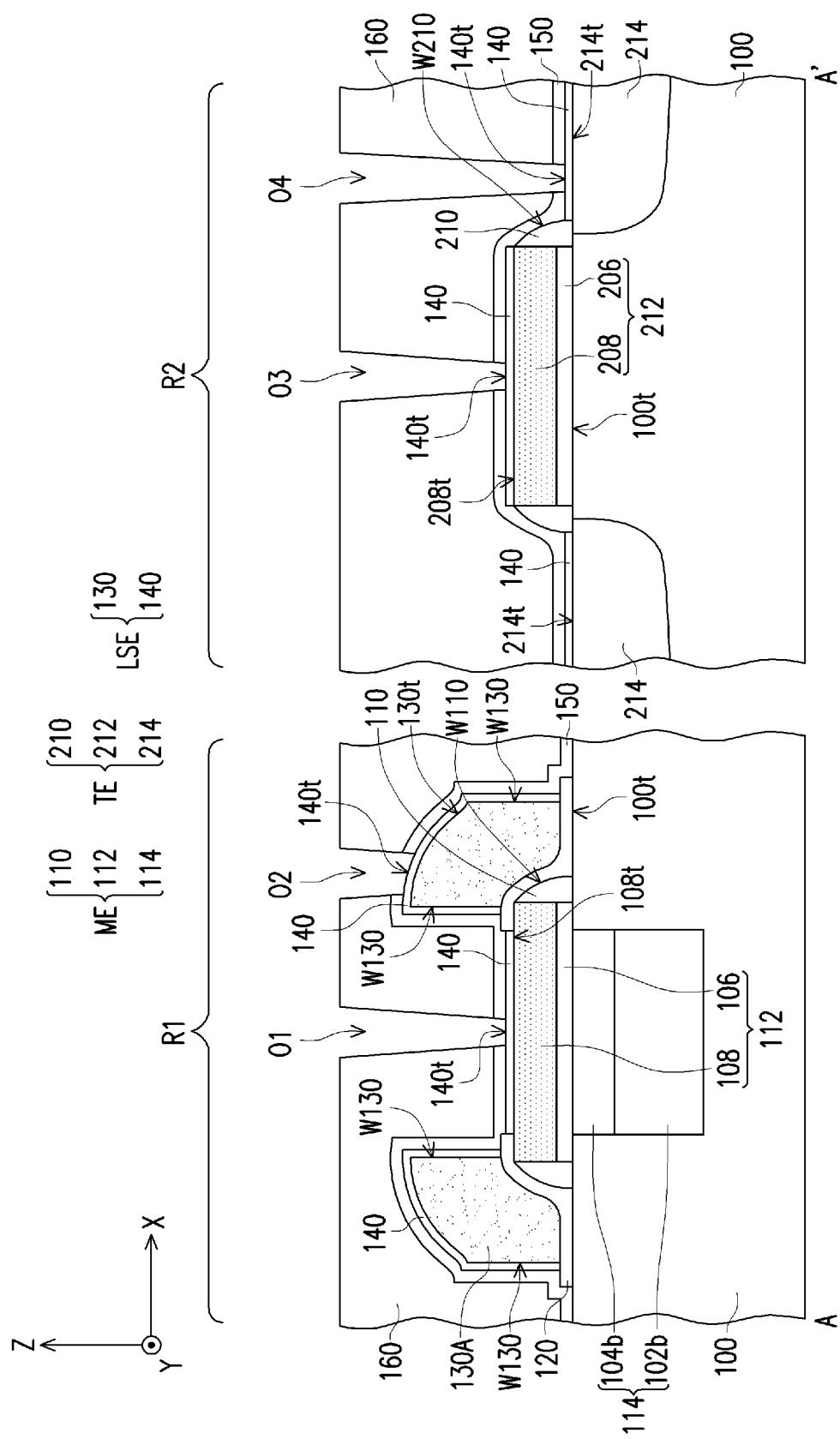

Referring to FIG. 10 and in accordance with step S307 of FIG. 17, in some embodiments, the dielectric layer 160 and the etch stop layer 150 are patterned to form a plurality of openings (or referred to as "recess" or "trench"), such as opening O1 through opening O4. In some embodiments, the openings O1, O2, O3 and O4 penetrate through the dielectric layer 160 and the etch stop layer 150, where the openings O1, O2, O3 and O4 respectively expose the silicide layer 140 overlaying the gate electrode 108, the semiconductor layer 130A, the gate electrode 208 and at least one of the source/drain regions 214 for future electrical connections. In some embodiments, the patterning process may include a photolithography process and an etching process.

Figure 11:
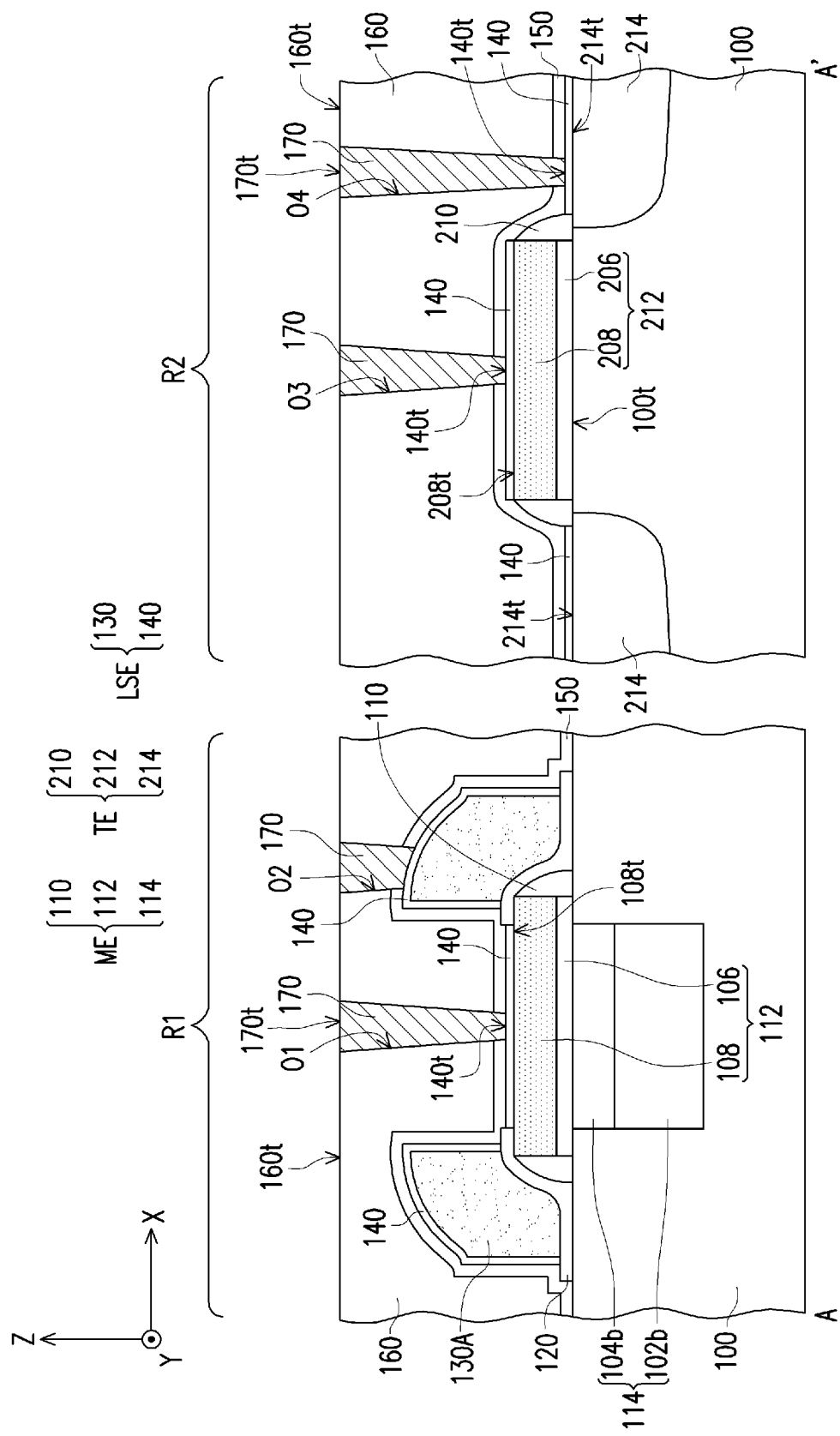

Referring to FIG. 11 and in accordance with step S308 of FIG. 17, in some embodiments, conductive contacts 170 are formed to fill into the openings O1-O4. In some embodiments, the conductive contacts 170 may be formed by the following manner. First, a conductive material (not shown) is deposited over the dielectric layer 160 and is filled into the openings O1 through O4. Subsequently, portions of the conductive material located outside of the openings O1 through O4 is removed to obtain the conductive contacts 170. In some embodiments, the conductive material may be removed through a CMP process, an etching process, or other suitable processes. As shown in FIG. 11, for example, top surfaces 170t of the conductive contacts 170 are substantially leveled with and substantially coplanar to the top surface 160t of the dielectric layer 160. The conductive contacts 170 may be referred to as metal contacts for the memory element ME and the shielding element of the storage device SD and for the transistor element TE. For example, the conductive contact 170 formed in the opening O1 is electrically coupled to the gate structure 112 of the memory element ME through the silicide layer 140, the conductive contact 170 formed in the opening O2 is electrically coupled to the semiconductor layer 130A through the silicide layer 140, within the region R1. Similarly, for example, the conductive contact 170 formed in the opening O3 is electrically coupled to the gate structure 212 of the transistor element TE through the silicide layer 140, and the conductive contact 170 formed in the opening O4 is electrically coupled to at least one of the source/drain regions 214 through the silicide layer 140, within the region R2.

Figure 12:
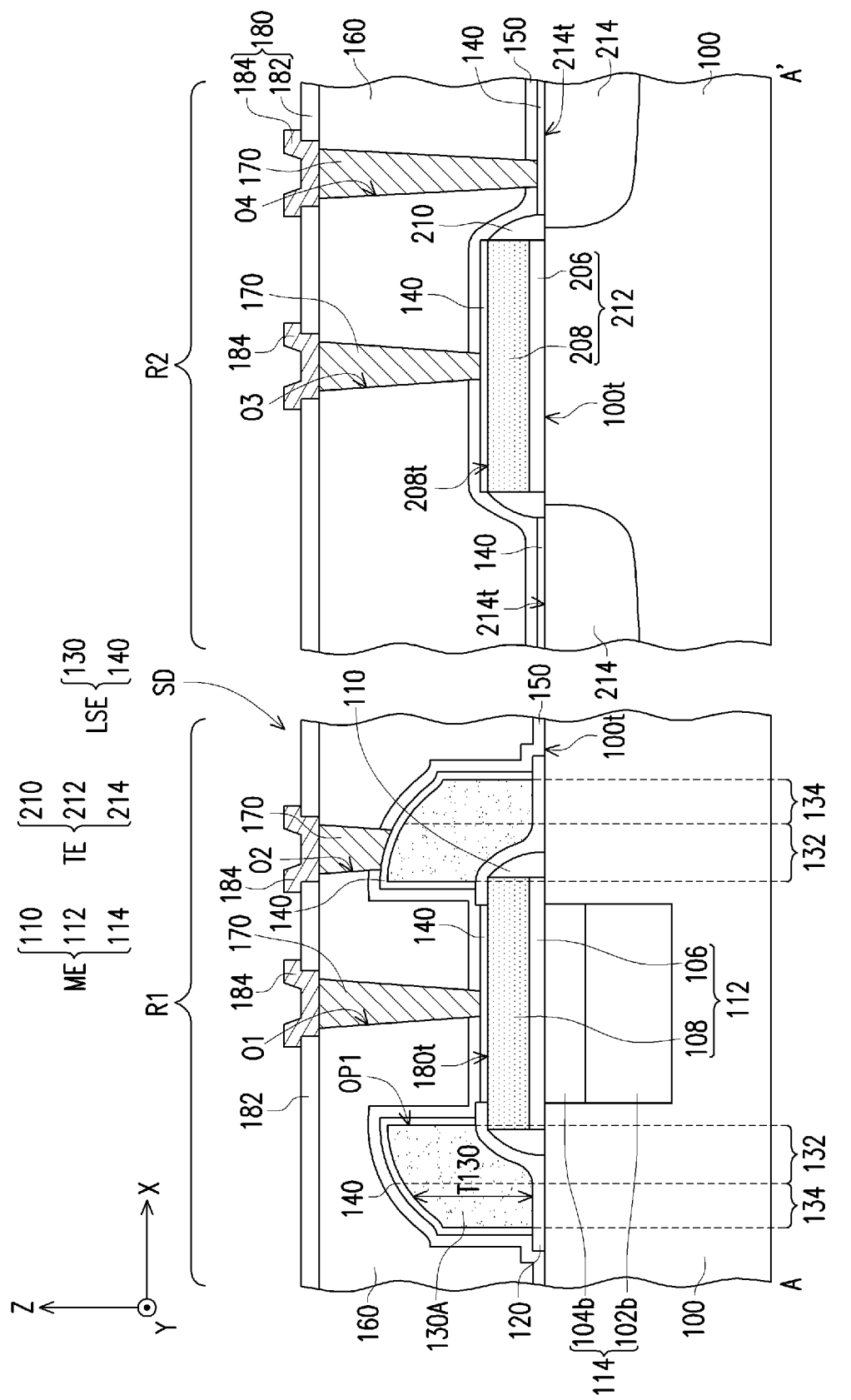
Figure 13:
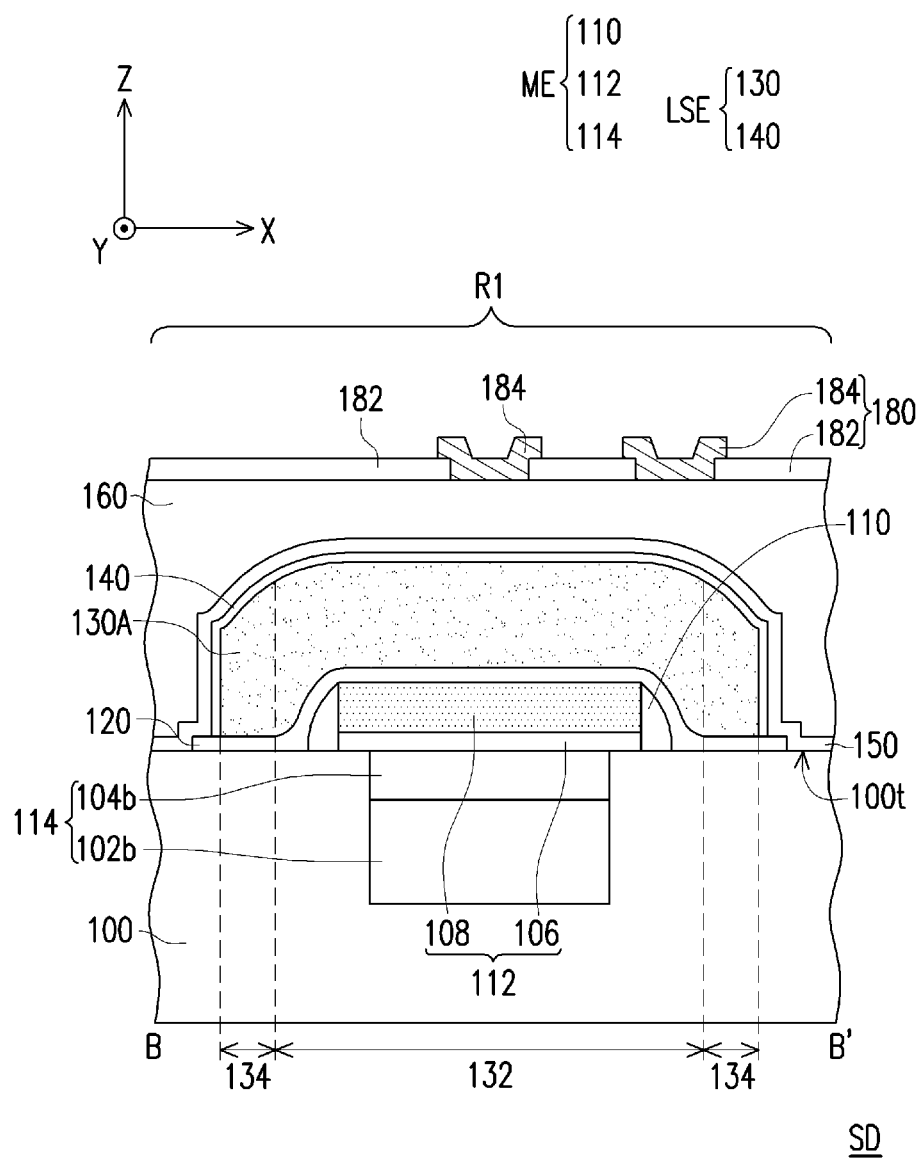
FIG. 13 is a schematic cross-sectional view of a storage device of a pixel unit of an image sensor accordance with some embodiments of the disclosure.

Referring to FIG. 12 and in accordance with step S309 of FIG. 17, in some embodiments, an interconnection structure 180 is formed over the dielectric layer 160 and the conductive contacts 170. During this stage, the storage device SD and the transistor (e.g., the transistor RST, SF or RS) are substantially completed. Similarly, the formations of the first transfer gate transistor TG1 between the photosensitive device PD and the storage device SD and the second transfer gate transistor TG2 between the storage device SD and the driving circuit DC may be formed in a manner similar to or identical to the formation of the transistor (e.g., the transistor RST, SF or RS) in the region R2, and thus the formations of the first transfer gate transistor TG1 and the second transfer gate transistor TG2 are omitted for brevity.

The interconnection structure 180 includes an interconnection dielectric layer 182 and a plurality of interconnection conductive patterns 184 at least partially embedded in the interconnection dielectric layer 182. In some embodiments, a material of the interconnection dielectric layer 182 includes polyimide, epoxy resin, acrylic resin, phenol resin, BCB, polybenzoxazole (PBO), or any other suitable polymer-based dielectric material. The interconnection dielectric layer 182, for example, may be formed by suitable fabrication techniques such as spin-on coating, CVD, PECVD, or the like. The interconnection conductive patterns 184 may be formed by the following manner. First, the interconnection dielectric layer 182 is patterned to form a plurality of openings (or referred to as "recess" or "trench") through a photolithography process and an etching process. Thereafter, the interconnection conductive patterns 184 are formed over the interconnection dielectric layer 182 and are formed to extend into the openings of the interconnection dielectric layer 182. The interconnection conductive patterns 184 may be formed by, for example, electroplating, deposition, and/or photolithography and etching. In some embodiments, a material of the interconnection conductive patterns 184 includes aluminum, titanium, copper, nickel, tungsten, and/or alloys thereof.

In some embodiments, as illustrated in FIG. 12, the conductive contact 170 formed in the opening O1 is in contact with both of the silicide layer 140 located on the gate electrode 108 and the interconnection conductive patterns 184 to render electrical connection between the gate electrode 108 and the interconnection conductive patterns 184, and the conductive contact 170 formed in the opening O2 is in contact with both of the silicide layer 140 located on the semiconductor layer 130A and the interconnection conductive patterns 184 to render electrical connection between the semiconductor layer 130A and the interconnection conductive patterns 184. Similarly, for example, the conductive contact 170 formed in the opening O3 is in contact with both of the silicide layer 140 located on the gate electrode 208 and the interconnection conductive patterns 184 to render electrical connection between the gate electrode 208 and the interconnection conductive patterns 184, and the conductive contact 170 formed in the opening O4 is in contact with both of the silicide layer 140 located on the at least one of the source/drain regions 214 and the interconnection conductive patterns 184 to render electrical connection between the at least one of the source/drain regions 214 and the interconnection conductive patterns 184.

Although FIG. 12 illustrated one layer of the interconnection structure 180, the disclosure is not limited thereto. In some alternative embodiments, the interconnection structure 180 may be a multi-layered structure. For example, the interconnection structure 180 may include a plurality of interconnection dielectric layers sequentially stacked on one another and a plurality of interconnection conductive patterns 184 sandwiched between/embedded in the interconnection dielectric layers 182.

FIG. 13 is schematic cross-sectional view of the region R1 (for the storage device SD) along line B-B' in FIG. 2. Referring to FIG. 2, the light shielding element LSE is located in the region R1 (for the storage device SD) and is free from the rest of the regions such as the region R2 (for the driving circuit DC). For example, the semiconductor layer 130A surrounds the conductive contacts 170 in the region R1 and is free from the conductive contacts 170 in the region R2, from the top view (e.g., the X-Y plane), in some embodiments.

Referring to FIG. 2, FIG. 12 and FIG. 13 simultaneously, for example, the semiconductor layer 130A substantially covers the gate electrode 108 and an active region OD1 of the storage device SD and exposes the gate electrode 208 and an active region OD2 of the transistor (e.g., the transistor RST, SF or RS in the driving circuit DC), from the top view. In some embodiments, the active region OD1 may be a region which performs storage function of the storage device SD, and the active region OD2 may be a region which performs logic processing function of the driving circuit DC. For example, the active region OD1 of the storage device SD may at least include the memory element ME having the first doped region 102b, the second doped region 104b and the gate electrode 108, while the active region OD2 of the transistor (e.g., the transistor RST, SF or RS in the driving circuit DC) may at least include the transistor element TE having the source/drain region 214 and the gate electrode 208. As mentioned above, since the storage device SD is being utilized to store the image charges received from the photosensitive device PD, the active region OD1 of the storage device SD is preferred to be free from the incident light to avoid damage to the stored image charges. By adapting the light shielding element LSE (e.g. the semiconductor layer 130A) which covers the active region OD1 of the storage device SD, the active region OD1 of the storage device SD may be shielded from the incident light. As such, the damage to the image charges stored in the storage device SD may be sufficiently prevented, thereby providing accurate image data for readout. Since the semiconductor layer 130A serves the function of shielding the active region OD1 of the storage device SD from the incident light, the semiconductor layer 130A may be electrically grounded through the conductive contact 170 formed in the opening O2 and the silicide layer 140, in some embodiments.

In some embodiments, as illustrated in FIG. 2, FIG. 12 and FIG. 13, for the light shielding element LSE, the semiconductor layer 130A include a central portion 132 and a periphery portion 134 surrounding the central portion 132, where the thickness T130 of the semiconductor layer 130A is constant. In some embodiments, a positioning location of the periphery portion 134 is offset from a positioning location of the gate structure 112 from the top view (e.g., the X-Y plane). A projection of the central portion 132 may be partially overlapped with the projection of the gate structure 112, on the X-Y plane in direction Z. For example, the central portion 132 include a plate structure having the opening OP1, where the opening OP1 is overlapped a portion of the gate structure 112, the plate structure extends on the substrate 100 over the gate structure 112 in a conformal manner (corresponding to the geometry of the memory element ME), and the periphery portion 134 extends on the substrate 100 aside of the gate structure 112. However, the disclosure is not limited thereto.

Figure 14A:
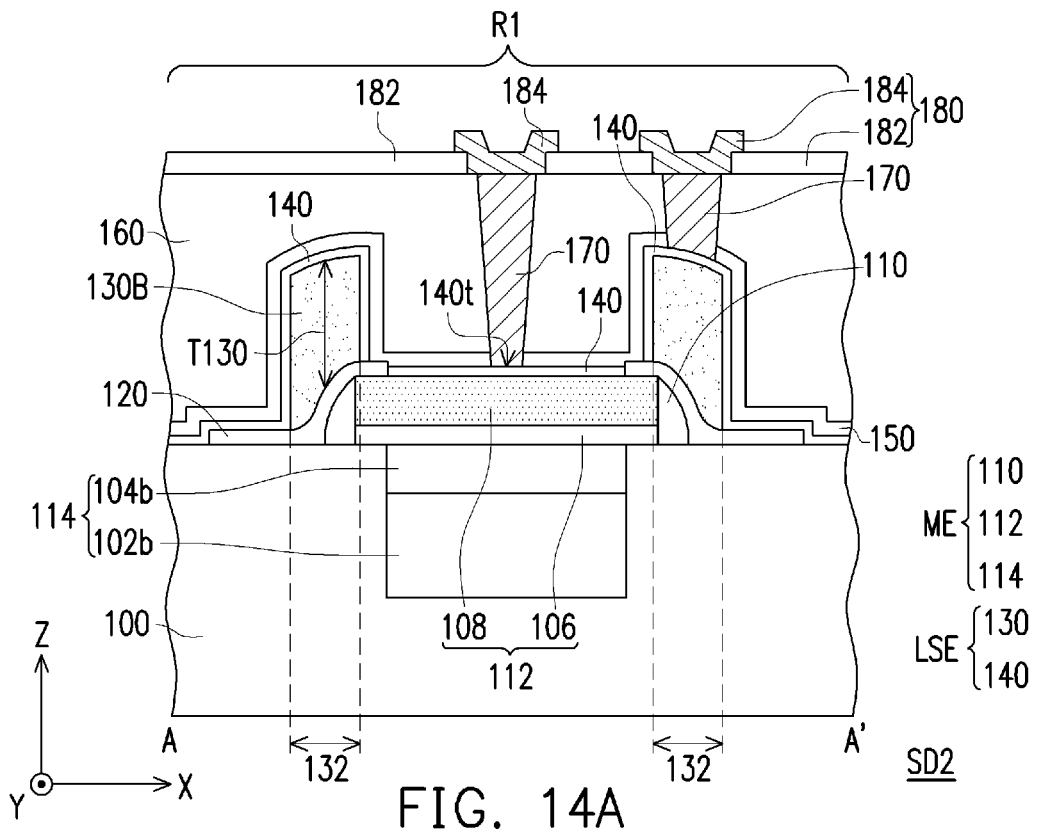
FIG. 14A and FIG. 14B are schematic cross-sectional views of a storage device of an image sensor of a semiconductor structure in accordance with some embodiments of the disclosure.
Figure 14B:
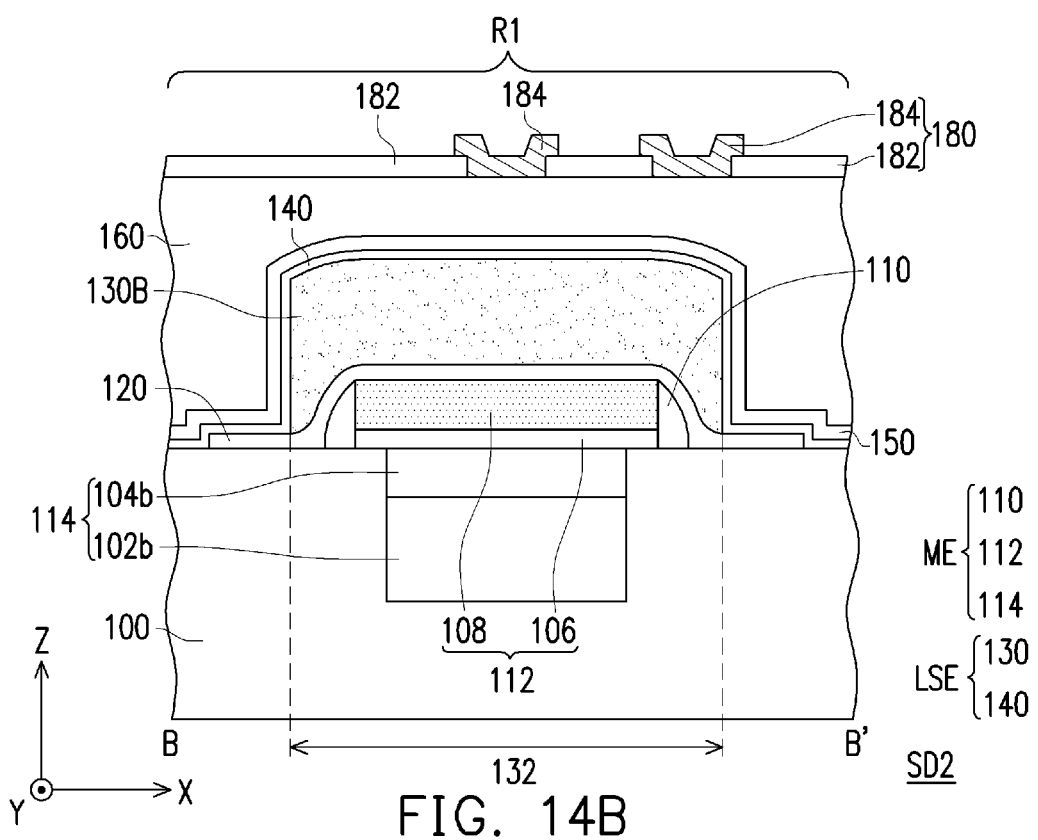

In alternative embodiments, in the light shielding element LSE, the semiconductor layer 130A may be substituted by a semiconductor layer 130B, see a storage device SD2 depicted in FIG. 14A and FIG. 14B. Similar to FIG. 12 and FIG. 13 as mentioned above, FIG. 14A is a schematic cross-sectional view of the region R1 (for the storage device SD2) along line A-A' in FIG. 2, while FIG. 14B is a schematic cross-sectional view of the region R1 (for the storage device SD2) along line B-B' in FIG. 2. The elements similar to or substantially the same as the elements described previously will use the same reference numbers, and certain details or descriptions of the same elements may not be repeated herein. In some embodiments, as compared with the semiconductor layer 130A depicted in FIG. 12 and FIG. 13, the difference is that, the semiconductor layer 130B excludes the periphery portion 134. For example, as shown in FIG. 14A and FIG. 14B, the semiconductor layer 130B only includes the central portion 132, where the thickness T130 of the semiconductor layer 130B is constant.

Figure 15A:
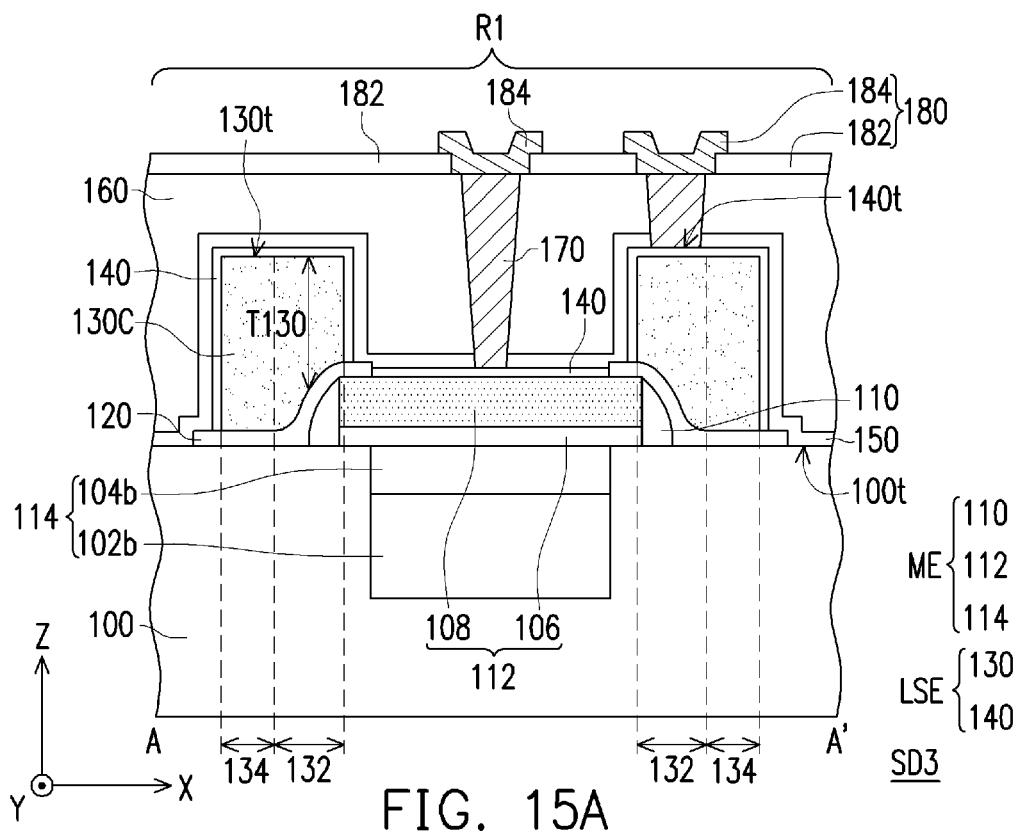
FIG. 15A and FIG. 15B are schematic cross-sectional views of a storage device of an image sensor of a semiconductor structure in accordance with some embodiments of the disclosure.
Figure 15B:
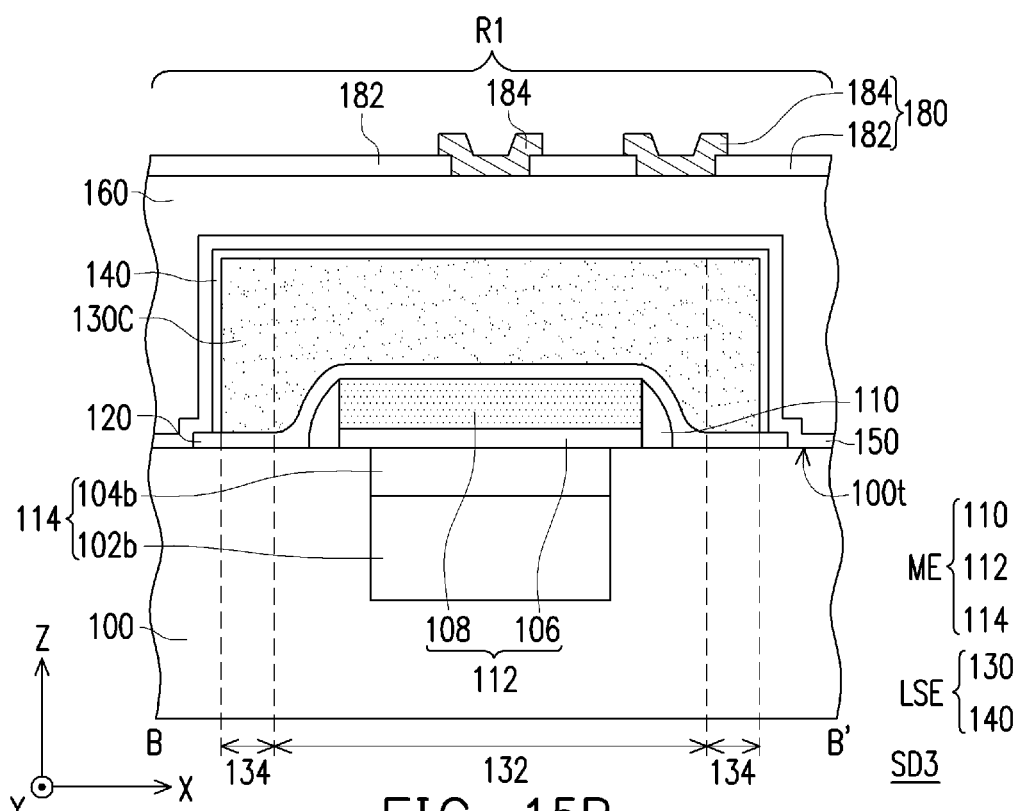

In other alternative embodiments, in the light shielding element LSE, the semiconductor layer 130A may be substituted by a semiconductor layer 130C, see a storage device SD3 depicted in FIG. 15A and FIG. 15B. Similar to FIG. 12 and FIG. 13 as mentioned above, FIG. 15A is a schematic cross-sectional view of the region R1 (for the storage device SD3) along line A-A' in FIG. 2, while FIG. 15B is a schematic cross-sectional view of the region R1 (for the storage device SD3) along line B-B' in FIG. 2. The elements similar to or substantially the same as the elements described previously will use the same reference numbers, and certain details or descriptions of the same elements may not be repeated herein. In some embodiments, as compared with the semiconductor layer 130A, the difference is that, the thickness T130 of the semiconductor layer 130C are non-constant. For example, as shown in FIG. 15A and FIG. 15B, the top surface 130t of the semiconductor layer 130C is substantially parallel to the top surface 100t of the substrate 100, where the thickness T130 of the semiconductor layer 130C is increased along a direction from the central portion 132 towards the periphery portion 134 (e.g., a radial direction from an edge of the opening OP1 toward the outer perimeter of the periphery portion 134).

Figure 16A:
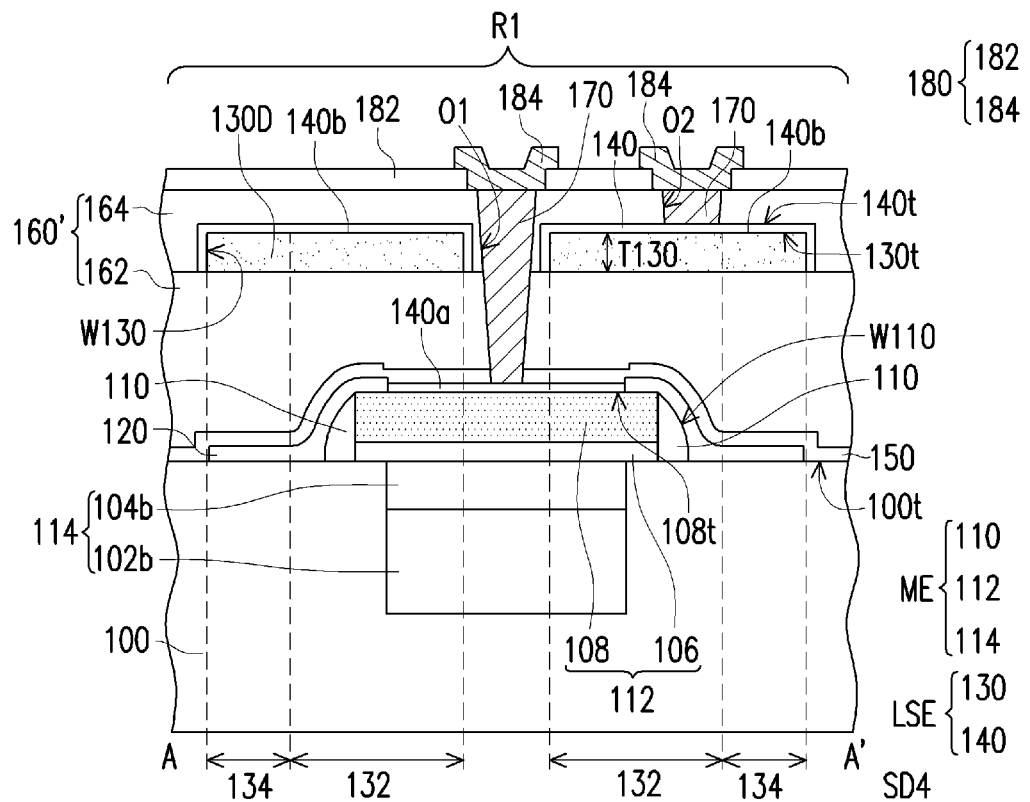
FIG. 16A and FIG. 16B are schematic cross-sectional views of a storage device of an image sensor of a semiconductor structure in accordance with some embodiments of the disclosure.
Figure 16B:
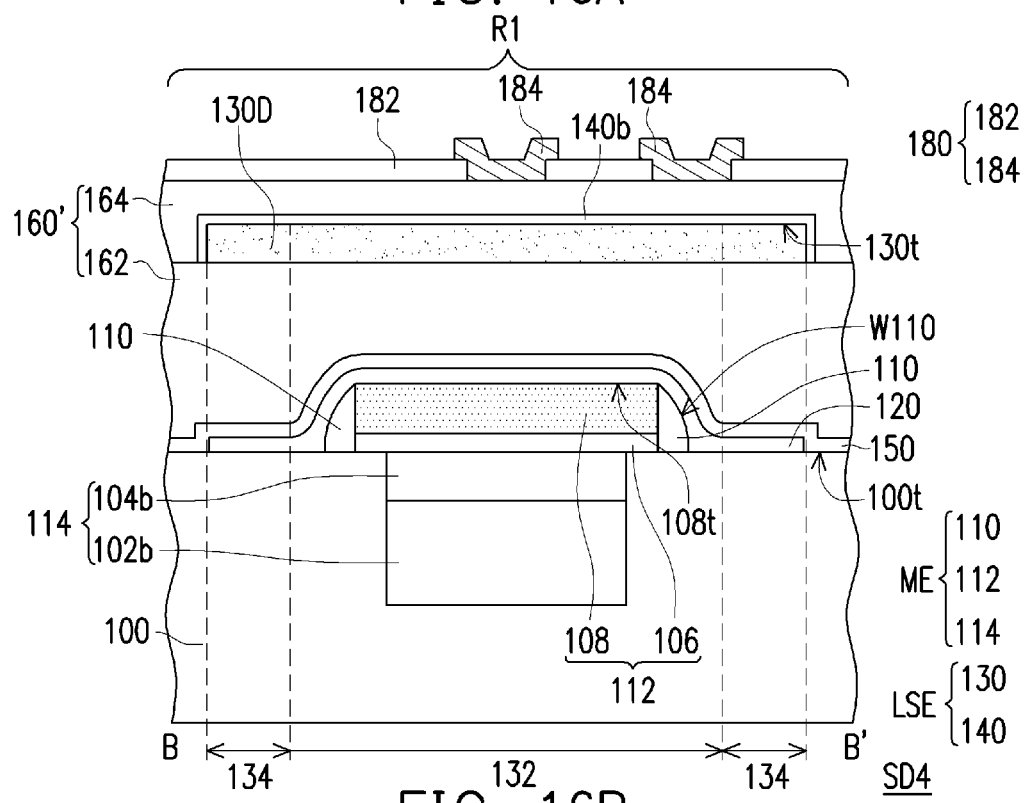

In further alternative embodiments, in the light shielding element LSE, the semiconductor layer 130A may be substituted by a semiconductor layer 130D, see a storage device SD4 depicted in FIG. 16A and FIG. 16B. Similar to FIG. 12 and FIG. 13 as mentioned above, FIG. 16A is a schematic cross-sectional view of the region R1 (for the storage device SD4) along line A-A' in FIG. 2, while FIG. 16B is a schematic cross-sectional view of the region R1 (for the storage device SD4) along line B-B' in FIG. 2. The elements similar to or substantially the same as the elements described previously will use the same reference numbers, and certain details or descriptions of the same elements may not be repeated herein. In some embodiments, instead the dielectric layer 160, the storage device SD 4 employs a dielectric layer 160', where the dielectric layer 160' includes a first portion 162 and a second portion 164 stacked thereon along the direction Z.

As illustrated in FIG. 16A and FIG. 16B, the memory node 114 (including the first doped region 102b and the second doped region 104b) is located in the substrate 100, the gate structure 112 and the spacers 110 are located on the substrate 100 over the memory node 114 to form the memory element ME, the dielectric layer 120 is located over the memory element ME and partially exposes a portion of the gate electrode 108, a silicide layer 140a is located on the portion of the gate electrode 108 exposed by the opening OP2 of the dielectric layer 120, a first portion 162 of the dielectric layer 160' is located over the memory element ME, the light shielding element LSE (including the semiconductor layer 130D and a silicide layer 140b disposed thereon) is located over the first portion 162, a second portion 164 of the dielectric layer 160' is located over the light shielding element LSE, the conductive contacts 170 are located in the dielectric layer 160' to electrically couple to the memory element ME and the light shielding element LSE, and the interconnection structure 180 is located on the dielectric layer 160' and electrically connected to the conductive contacts 170. For example, one of the conductive contacts 170 is located in the opening O1 penetrating the first portion 162 and the second portion 164 of the dielectric layer 160' to electrically couple to the memory element ME by being in contact with the silicide layer 140a. For another example, one of the conductive contacts 170 is located in the opening O2 penetrating the second portion 164 of the dielectric layer 160' to electrically couple to the light shielding element LSE by being in contact with the silicide layer 140b. The silicide layer 140b may be in contact with the top surface 130t of the semiconductor layer 130D. The silicide layer 140b may be further in contact with the sidewalls of the semiconductor layer 130D.

In some embodiments, in FIG. 16A and FIG. 16B, the dielectric layer 120, the etch stop layer 150 and the first portion 162 of the dielectric layer 160' are located between the semiconductor layer 130D and the gate electrode 108, the sufficient isolation between light shielding element LSE (e.g., the semiconductor layer 130D) and the memory element ME (e.g., the gate electrode 108) can be certainly provided, thereby ensuring longer lifetime of the storage device SD4. In some embodiments, in the light shielding element LSE, the semiconductor layer 130D include a central portion 132 and a periphery portion 134 surrounding the central portion 132, where the thickness T130 of the semiconductor layer 130D is constant. In some embodiments, a positioning location of the periphery portion 134 is offset from a positioning location of the gate structure 112 from the top view (e.g., the X-Y plane). The central portion 132 may be partially overlapped with the gate structure 112 in the vertical projection on the X-Y plane along direction Z. For example, the central portion 132 include a plate structure having an opening (not labelled), where the opening is overlapped with the opening O1, a portion of the gate structure 112, the plate structure extends on the substrate 100 over the gate structure 112 in a non-conformal manner (corresponding to the geometry of the memory element ME), and the periphery portion 134 extends on the substrate 100 aside of the gate structure 112. However, the disclosure is not limited thereto. In other words, the plate structure of the semiconductor layer 130D is flat and planar.

The formations and materials of the first silicide layer 140a and the second silicide layer 140b are similar to or substantially identical to the formation and material of the silicide layer 140 as described in FIG. 7, and the formations and materials of the first portion 162 and the second portion 164 of the dielectric layer 160' are similar to or substantially identical to the formation and material of the dielectric layer 160 as described in FIG. 9, and thus are not repeated herein for brevity.

Figure 18:
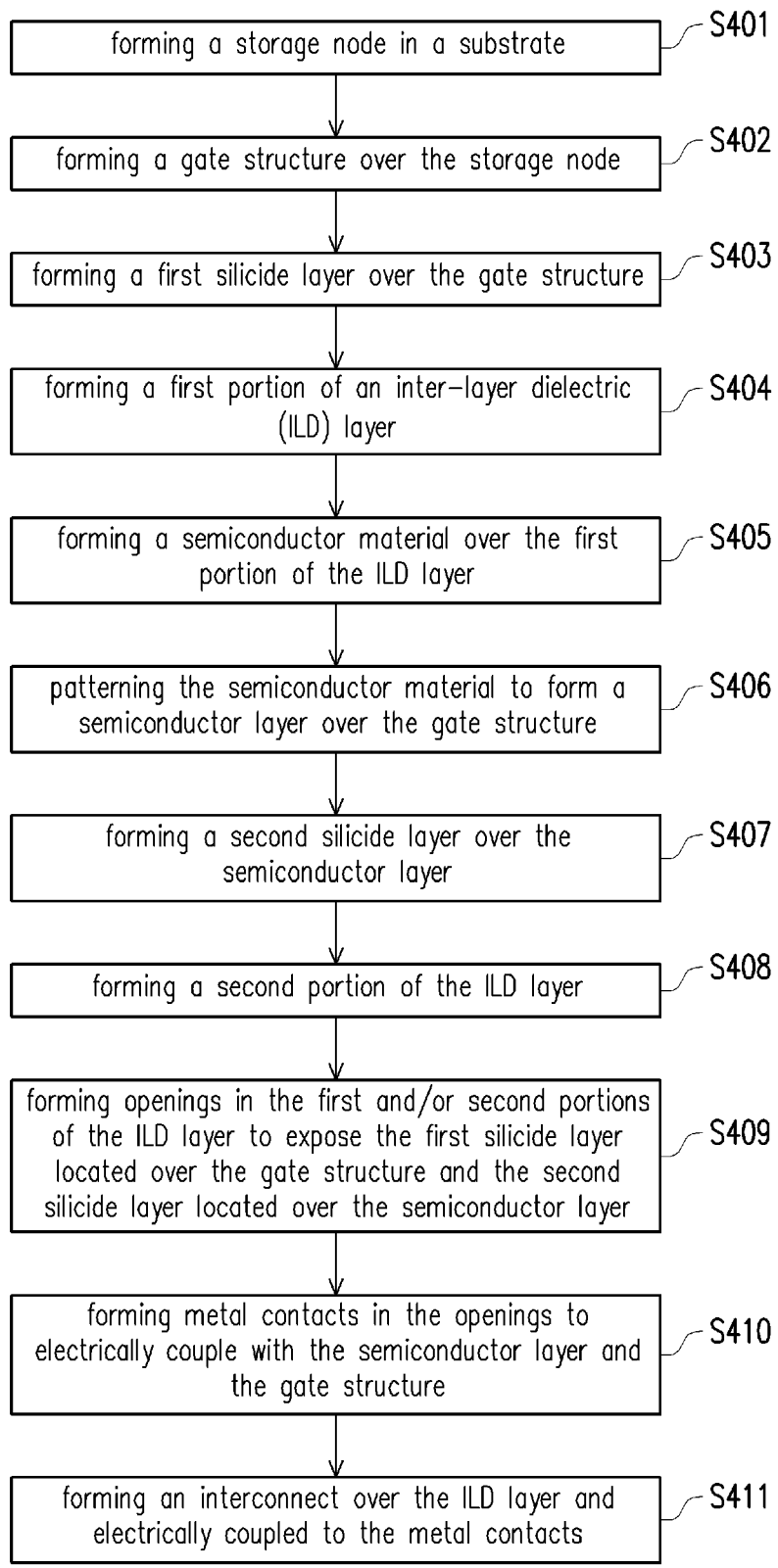
FIG. 18 is a flowchart illustrating a manufacturing method of an image sensor in accordance with some embodiments of the disclosure.

In one embodiment, the storage device SD4 may be manufactured by a method of FIG. 18. It should be understood that additional processing may occur before, during, and after the illustrated actions of the method of FIG. 18 to complete formation of the storage device SD4. The method of FIG. 18 includes at least step S401 to step S411. For example, the method shown in FIG. 18 begins with step S401, which forms a storage node in a substrate; step S402, which forms a gate structure over the storage node; step S403, which forms a first silicide layer over the gate structure; step S404, which forms a first portion of an inter-layer dielectric (ILD) layer, step S405, which forms a semiconductor material over the first portion of the ILD layer; step S406, which patterns the semiconductor material to form a semiconductor layer over the gate structure; step S407, which forms a second silicide layer over the semiconductor layer; step S408, which forms a second portion of the ILD layer; step S409, which forms openings in the first and/or second portions of the ILD layer to expose the first silicide layer located over the gate structure and the second silicide layer located over the semiconductor layer; step S410, which forms metal contacts in the openings to electrically couple with the semiconductor layer and the gate structure; and step S411, which forms an interconnect over the ILD layer, the interconnect being electrically coupled to the metal contacts.

In accordance with some embodiments, an image sensor includes a storage device, where the storage device includes a memory element, a first dielectric layer and a light shielding element. The memory element includes a storage node and a storage transistor gate, where the storage transistor gate is located over the storage node. The first dielectric layer is located over a portion of the storage transistor gate. The light shielding element is located on the first dielectric layer and includes a semiconductor layer. The semiconductor layer is electrically isolated from the memory element, where the light shielding element is overlapped with at least a part of a perimeter of the storage transistor gate in a vertical projection on a plane along a stacking direction of the memory element and the light shielding element, and the stacking direction is normal to the plane.

In accordance with some embodiments, an image sensor includes a photosensitive device, a storage device adjacent to the photosensitive device, and a driving circuit adjacent to the storage device. The storage device includes a substrate, a P-N junction, a gate dielectric layer, a gate electrode, a first dielectric layer, a shielding layer and a second dielectric layer. The P-N junction is located within the substrate. The gate dielectric layer is located on the substrate and over the P-N junction. The gate electrode is located over the gate dielectric layer. The first dielectric layer has a first portion located on the gate electrode and a second portion located on the substrate, where the first portion connects to the second portion. The shielding layer is located over and electrically isolated from the gate electrode. The second dielectric layer is over the shielding layer and the gate electrode, where the shielding layer is overlapped with at least edges of the gate electrode in a vertical projection on the substrate along a stacking direction of the substrate and the gate electrode.

In accordance with some embodiments, a method of manufacturing an image sensor includes the following steps, providing a substrate; forming a storage node in the substrate; forming a storage transistor gate on the substrate over the storage node; forming a first dielectric material over the storage transistor gate and the substrate; forming a semiconductor material over the first dielectric material; patterning the semiconductor material to form a shielding layer having a first contact hole to expose a portion of the first dielectric material located atop the storage transistor gate; patterning the first dielectric material exposed by the first contact hole to form a first dielectric layer having a second contact hole to expose the storage transistor gate; forming a first silicide layer on the storage transistor gate exposed by the first contact hole formed in the shielding layer and by the second contact hole formed in the first dielectric layer; and forming a second silicide layer on the shielding layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. An image sensor, comprising:
   a storage device, comprising:
      a memory element, comprising:
         a storage node; and
         a storage transistor gate, located over the storage node; and
      a first dielectric layer, located over a portion of the storage transistor gate; and
      a light shielding element, located on the first dielectric layer and comprising:
         a semiconductor layer, electrically isolated from the memory element, wherein the light shielding element is overlapped with at least a part of a perimeter of the storage transistor gate in a vertical projection on a plane along a stacking direction of the memory element and the light shielding element,
   wherein the stacking direction is normalo the plane.

2. The image sensor of claim 1, wherein the storage node comprises a P-N junction.

3. The image sensor of claim 1, wherein the memory element further comprises:
   a first metal silicide layer, located over and electrically coupled to the storage transistor gate revealed by the first dielectric layer,
   wherein the storage transistor gate comprises:
      a gate electrode, a portion thereof revealed by a first recess formed in the first dielectric layer; and
      a gate dielectric layer, located between the storage node and the gate electrode,
   wherein the first metal silicide layer is in contact with the portion of the gate electrode exposed by the first recess formed in the first dielectric layer.

4. The image sensor of claim 1, wherein the light shielding element further comprises:
   a second metal silicide layer, located over and in contact with the semiconductor layer.

5. The image sensor of claim 1, wherein the storage device further comprises a substrate, the storage node being in the substrate and the storage transistor gate being on the substrate,
   wherein the first dielectric layer comprises:
      a first dielectric portion, extending over the storage transistor gate; and
      a second dielectric portion, extending over the substrate and aside of the storage transistor gate, and the first dielectric portion and the second dielectric portion are connected to one another, and
   wherein the light shielding element comprises:
      a first shielding portion, located on the first dielectric portion.

6. The image sensor of claim 5, wherein the storage device further comprises
   a second dielectric layer, located between the light shielding element and the memory element and located between the first dielectric layer and the light shielding element.

7. The image sensor of claim 5, wherein the light shielding element further comprises:
   a second shielding portion, located over the second dielectric portion, and the first dielectric portion and the second dielectric portion are connected to one another.

8. The image sensor of claim 7, wherein a thickness of the light shielding element is non-constant.

9. The image sensor of claim 7, wherein the storage device further comprises
   a second dielectric layer, located between the light shielding element and the memory element and located between the first dielectric layer and the light shielding element.

10. The image sensor of claim 1, wherein the light shielding element is configured to be electrically grounded.

11. An image sensor, comprising:
    a photosensitive device;
    a storage device adjacent to the photosensitive device, comprising:
       a substrate;
       a P-N junction, located within the substrate;
       a gate dielectric layer, located on the substrate and over the P-N junction;
       a gate electrode, located over the gate dielectric layer;

a first dielectric layer, having a first portion located on the gate electrode and a second portion located on the substrate, the first portion connecting to the second portion;

a shielding layer, located over and electrically isolated from the gate electrode, wherein a material of the shielding layer comprises a semiconductor material; and a second dielectric layer, over the shielding layer and the gate electrode, wherein the shielding layer is overlapped with at least edges of the gate electrode in a vertical projection on the substrate along a stacking direction of the substrate and the gate electrode; and a driving circuit adjacent to the storage device.

12. The image sensor of claim 11, wherein the storage device further comprises:

a first metal contact, located in the second dielectric layer and electrically grounding the shielding layer;

a second metal contact, locate in the second dielectric layer and electrically coupled to the gate electrode, the second metal contact penetrating the second dielectric layer and passing through a first recess formed in the shielding layer and a second recess formed in the first dielectric layer; and an interconnect, located on the second dielectric layer and electrically coupled to the first metal contact and the second metal contact.

13. The image sensor of claim 12, wherein the first recess formed in the shielding layer and the second recess formed in the first dielectric layer are overlapped the gate electrode in the vertical projection on the substrate along the stacking direction.

14. The image sensor of claim 13, wherein a perimeter of the first recess formed in the shielding layer is offset from a perimeter of the second recess formed in the first dielectric layer in the vertical projection on the substrate along the stacking direction.

15. The image sensor of claim 11, wherein the shielding layer comprises:

a first plate structure having a first shielding portion with a recess formed therein and a second shielding portion connected to and surrounding the first shielding portion, wherein the first shielding portion extends on the first portion of the first dielectric layer, the recess is located atop the gate electrode, and the second shielding portion extends on the second portion of the first dielectric layer; or a second plate structure having a third shielding portion with a recess formed therein, wherein the third shielding portion extends on the first portion of the first dielectric layer, and the recess is located atop of the gate electrode.

* * * * *